(12) United States Patent
Saeki et al.

(10) Patent No.: US 6,984,097 B1
(45) Date of Patent: Jan. 10, 2006

(54) MOUNTING/DEMOUNTING DEVICE FOR WAFER CARRIER LID

(75) Inventors: Hiroaki Saeki, Shirane-Machi (JP); Yoshiaki Sasaki, Yamanashi-Ken (JP); Keiichi Matsushima, Kofu (JP); Yasushi Taniyama, Toyohashi (JP); Shuuji Hagiwara, Toyohashi (JP)

(73) Assignee: Tokyo Electron Limited, Tokyo-To (JP)

( * ) Notice: Subject to any disclaimer, the term of this patent is extended or adjusted under 35 U.S.C. 154(b) by 42 days.

(21) Appl. No.: 10/019,227

(22) PCT Filed: Jun. 28, 2000

(86) PCT No.: PCT/JP00/04233

§ 371 (c)(1),
(2), (4) Date: Apr. 17, 2002

(87) PCT Pub. No.: WO01/01479

PCT Pub. Date: Jan. 4, 2001

(30) Foreign Application Priority Data

Jun. 28, 1999 (JP) .................................. 11-181475

(51) Int. Cl.
*B65G 49/07* (2006.01)

(52) U.S. Cl. .................................... 414/411; 414/217.1
(58) Field of Classification Search ................ 414/217, 414/217.1, 411, 940
See application file for complete search history.

(56) References Cited

U.S. PATENT DOCUMENTS

| | | | |
|---|---|---|---|
| 5,674,039 A | * | 10/1997 | Walker et al. ......... 414/222.05 |
| 5,711,427 A | * | 1/1998 | Nyseth ....................... 206/710 |
| 5,730,573 A | | 3/1998 | Masujima et al. .......... 414/217 |
| 5,772,386 A | | 6/1998 | Mages et al. ................ 414/411 |
| 6,062,808 A | | 5/2000 | Masujima et al. |
| 6,071,059 A | | 6/2000 | Mages et al. |
| 6,082,951 A | | 7/2000 | Nering et al. ............ 414/217.1 |

(Continued)

FOREIGN PATENT DOCUMENTS

EP 0 827 185 3/1998

(Continued)

OTHER PUBLICATIONS

PCT Notification of Transmittal of Copies of Translation of the International Preliminary Examination Report (PCT/IB/338) issued for PCT/JP00/04233.

(Continued)

*Primary Examiner*—James W. Keenan
(74) *Attorney, Agent, or Firm*—Smith, Gambrell & Russell, LLP

(57) ABSTRACT

An attaching and removing unit of a lid for a wafer carrier according to the invention includes: a lid holding plate that can move forward and backward relatively to a lid for a wafer carrier provided with a lock unit having a keyhole exposed outside, on a side of the keyhole; a driver for causing the lid holding plate to move forward and backward; and a key element protruding from the lid holding plate on a side of the lid in a pivotable manner, the key element disposed opposite the keyhole in a direction of the forward and backward movement. The lock unit is adapted to be locked and unlocked by the key element pivoting in the keyhole. In a locked state, the key element can be inserted into and released from the keyhole, and in an unlocked state, the key element is engaged with and can not be released from the keyhole, while the lid holding plate holds the lid. The lid holding plate is provided with a lid-detecting unit for detecting whether the lid holding plate is holding the lid or not.

8 Claims, 31 Drawing Sheets

U.S. PATENT DOCUMENTS

| | | | |
|---|---|---|---|
| 6,158,946 A * | 12/2000 | Miyashita | 414/411 |
| 6,261,044 B1 * | 7/2001 | Fosnight et al. | 414/217 |
| 6,281,516 B1 * | 8/2001 | Bacchi et al. | 250/559.29 |
| 6,375,403 B1 | 4/2002 | Mages et al. | |
| 6,461,094 B1 | 10/2002 | Mages et al. | |
| 6,520,726 B1 | 2/2003 | Cook et al. | |
| 6,530,736 B2 * | 3/2003 | Rosenquist | 414/411 |
| 6,641,348 B1 * | 11/2003 | Schultz et al. | 414/217 |
| 6,704,998 B1 * | 3/2004 | Bonora et al. | 29/700 |
| 6,896,470 B1 * | 5/2005 | Chen et al. | 414/411 |
| 2002/0090284 A1 | 7/2002 | Mages et al. | |
| 2003/0206795 A1 | 11/2003 | Mages et al. | |

FOREIGN PATENT DOCUMENTS

| | | |
|---|---|---|
| JP | 7-235580 | 9/1995 |
| JP | 10-125763 | 5/1998 |
| JP | 11-354602 | 12/1999 |
| JP | 11-354622 | 12/1999 |
| WO | WO 00/51920 | 9/2000 |

OTHER PUBLICATIONS

International Preliminary Examination Report (PCT/IPEA/409) (translated) issued for PCT/JP00/04233.

* cited by examiner

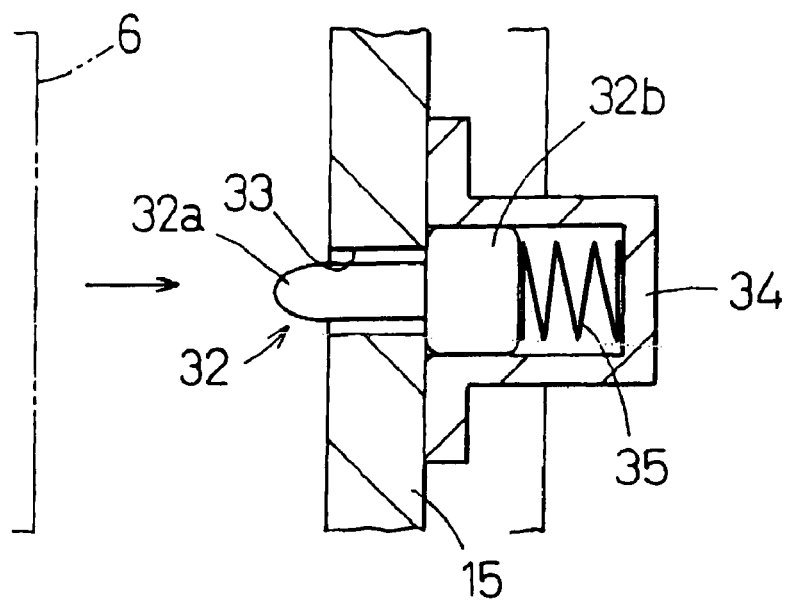
F I G. 14
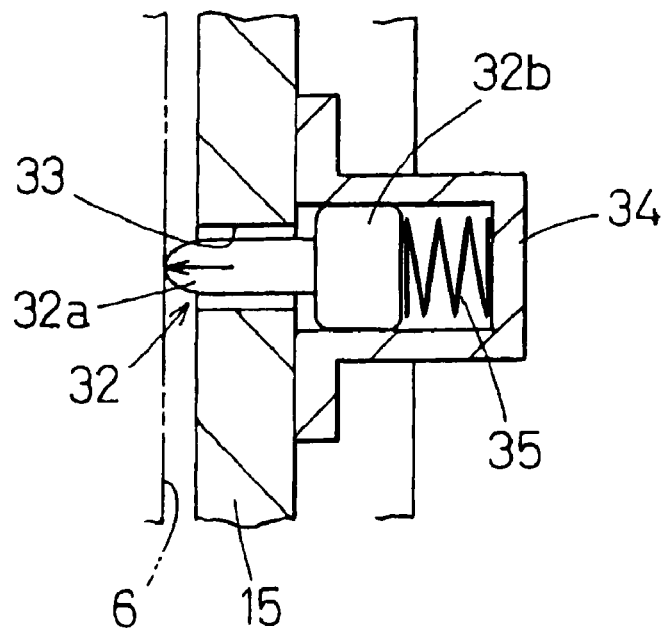
F I G. 15

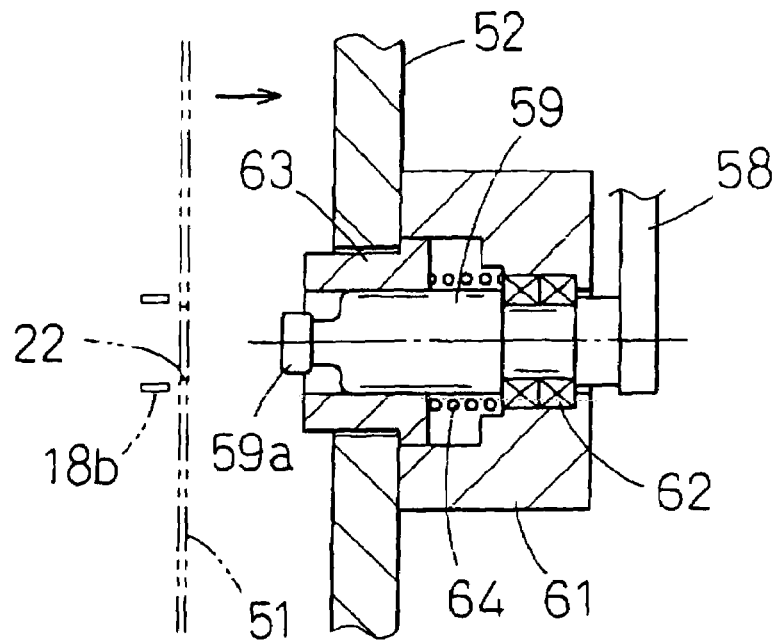
F I G. 23
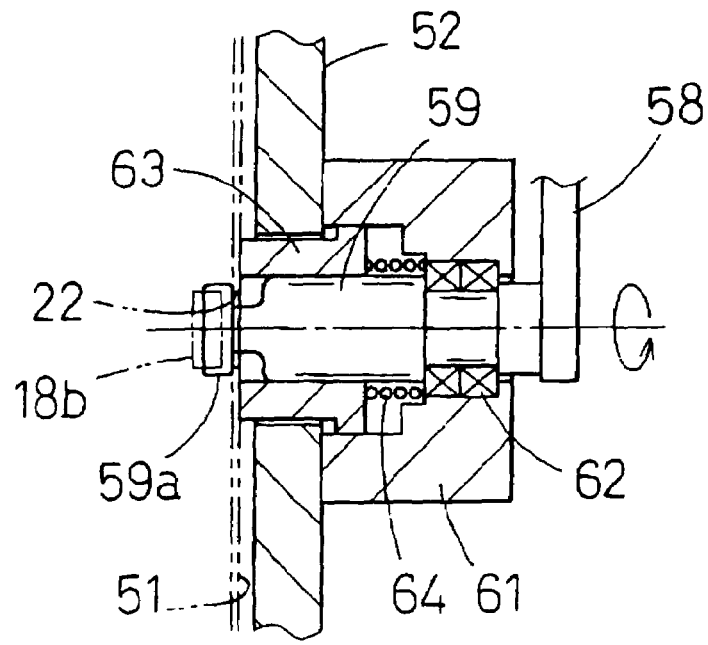
F I G. 24

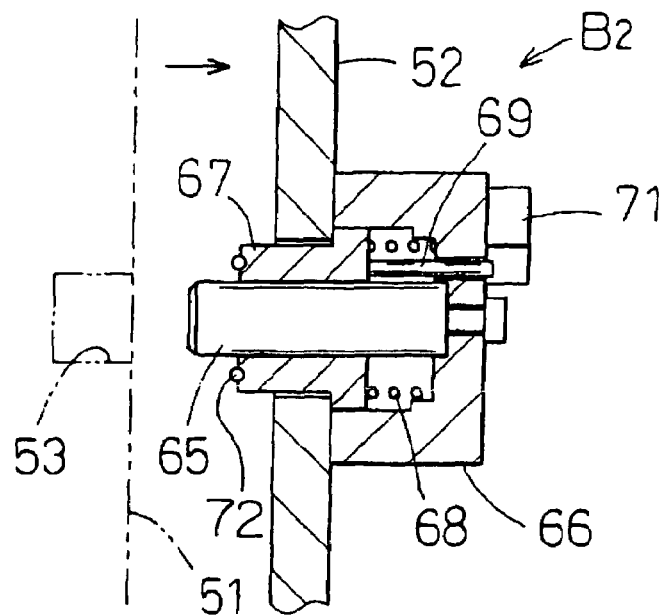
F I G. 27
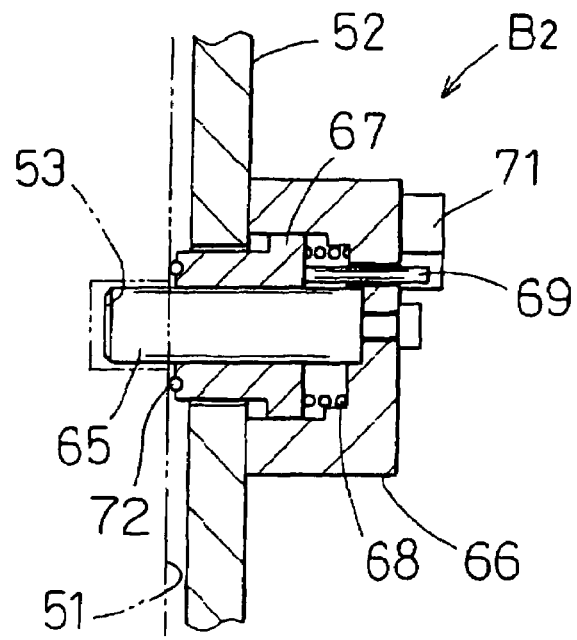
F I G. 28

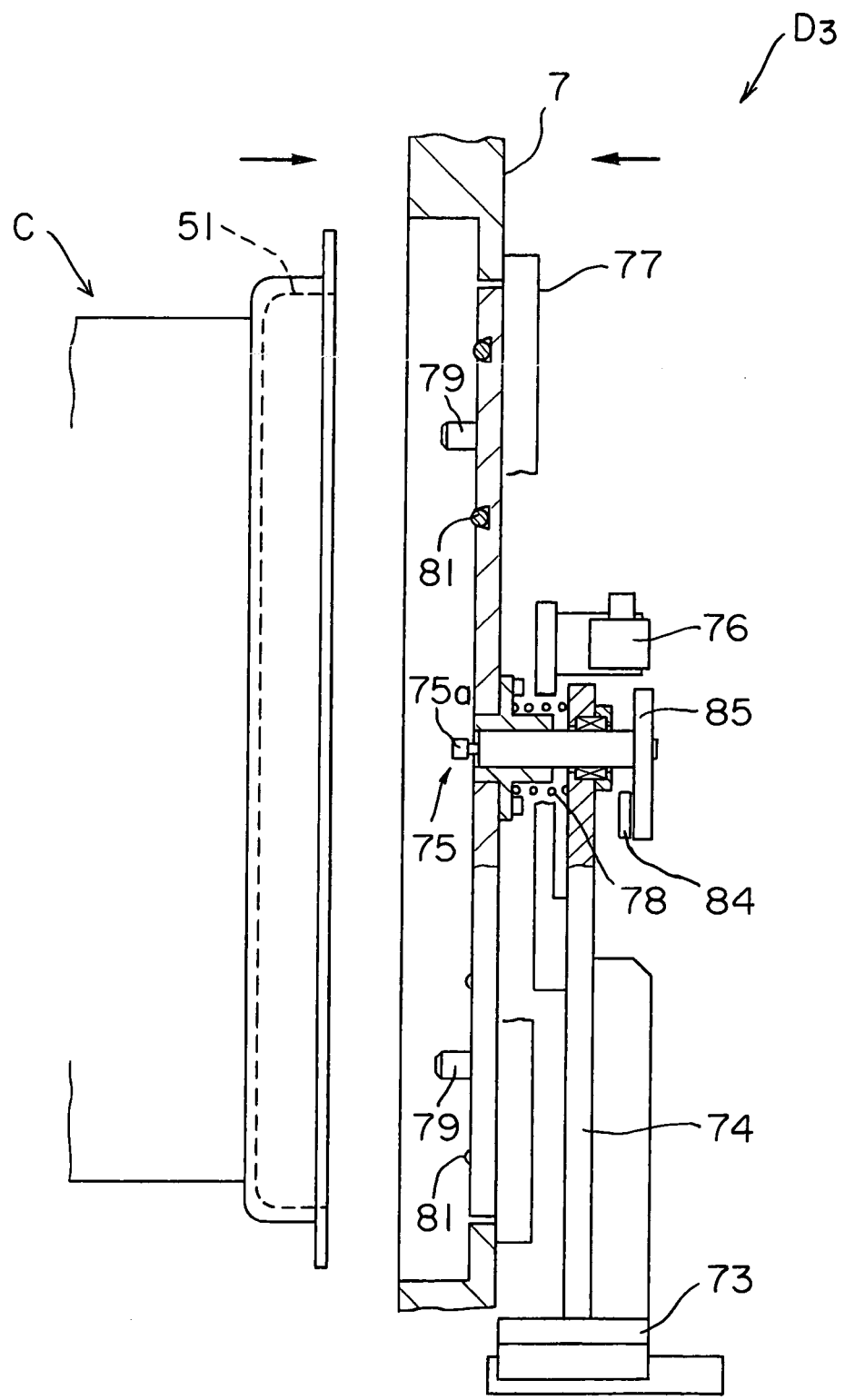
F I G. 30

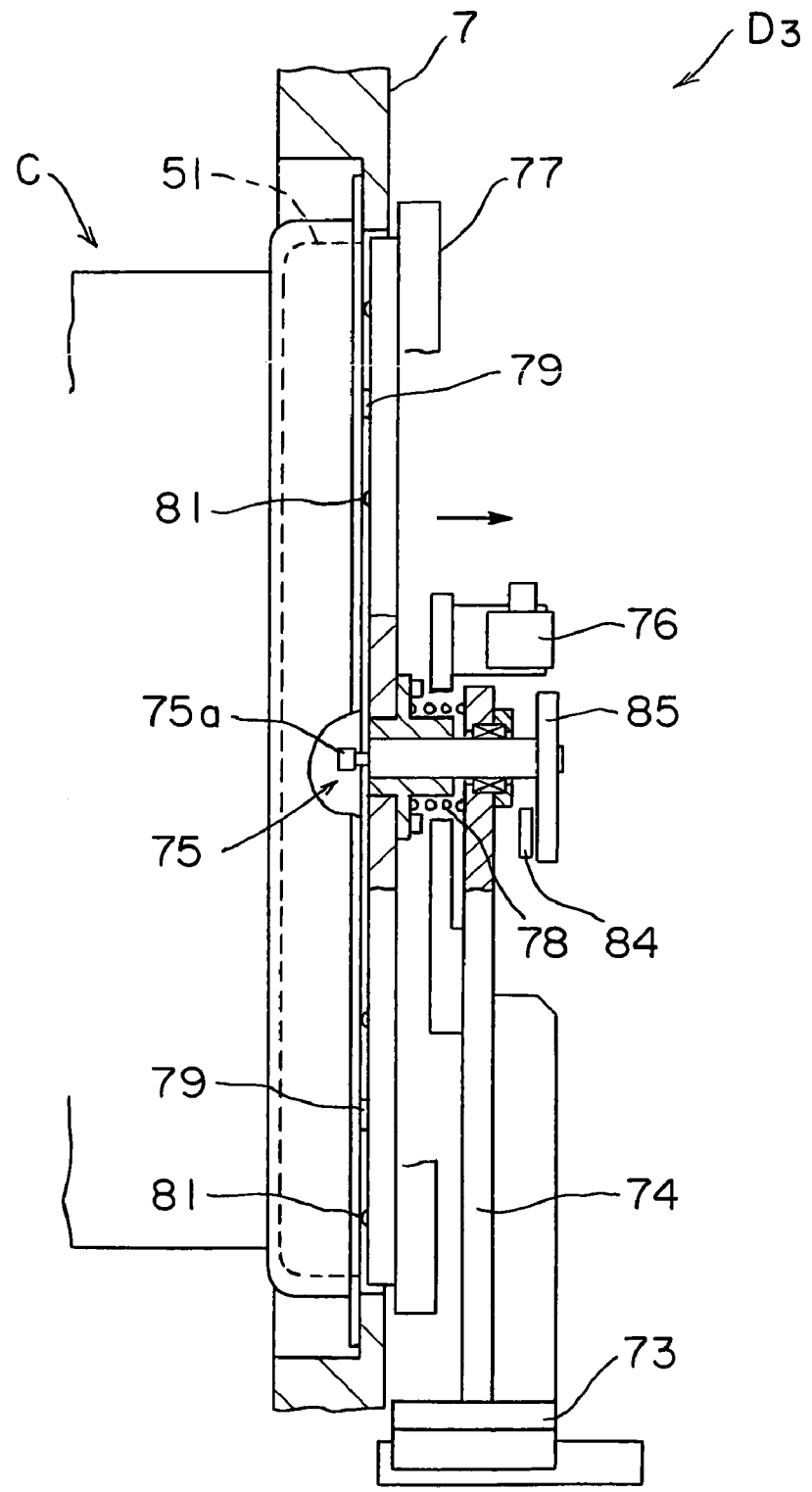
F I G. 31

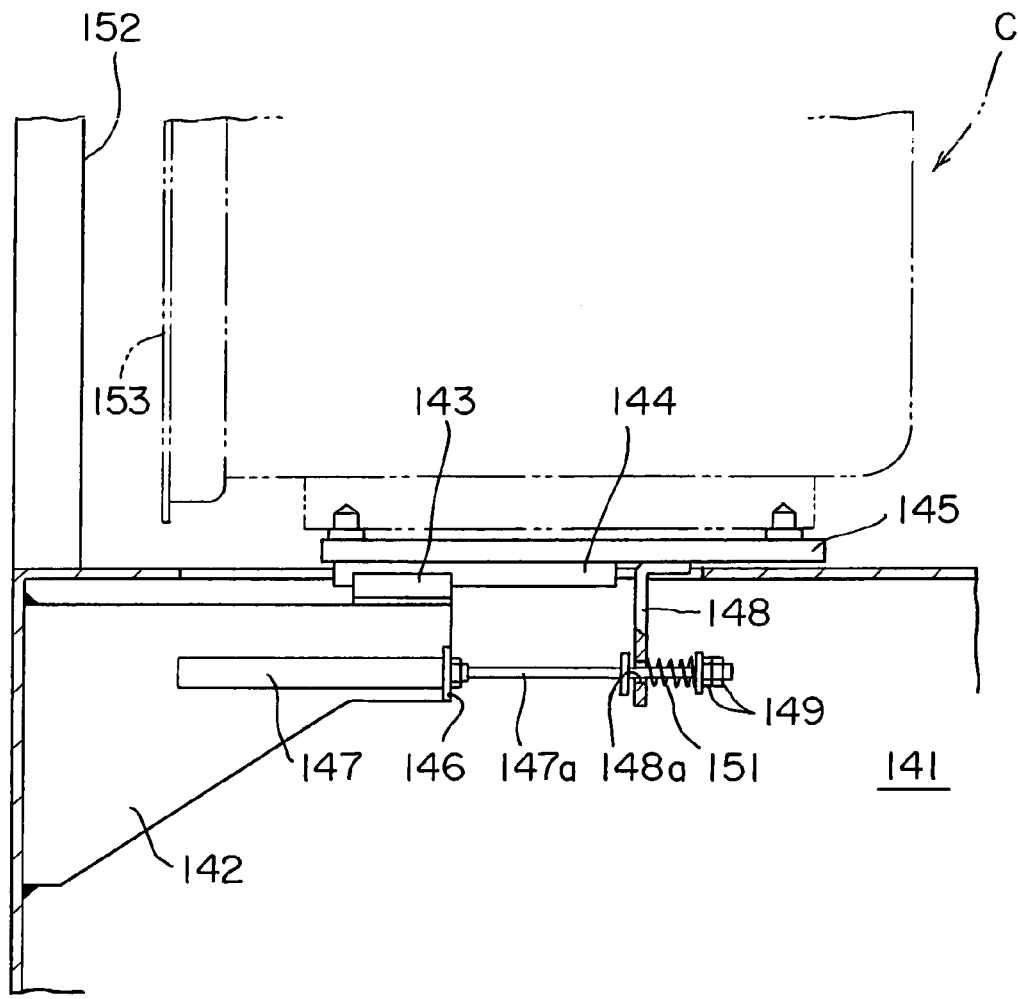
F I G. 33

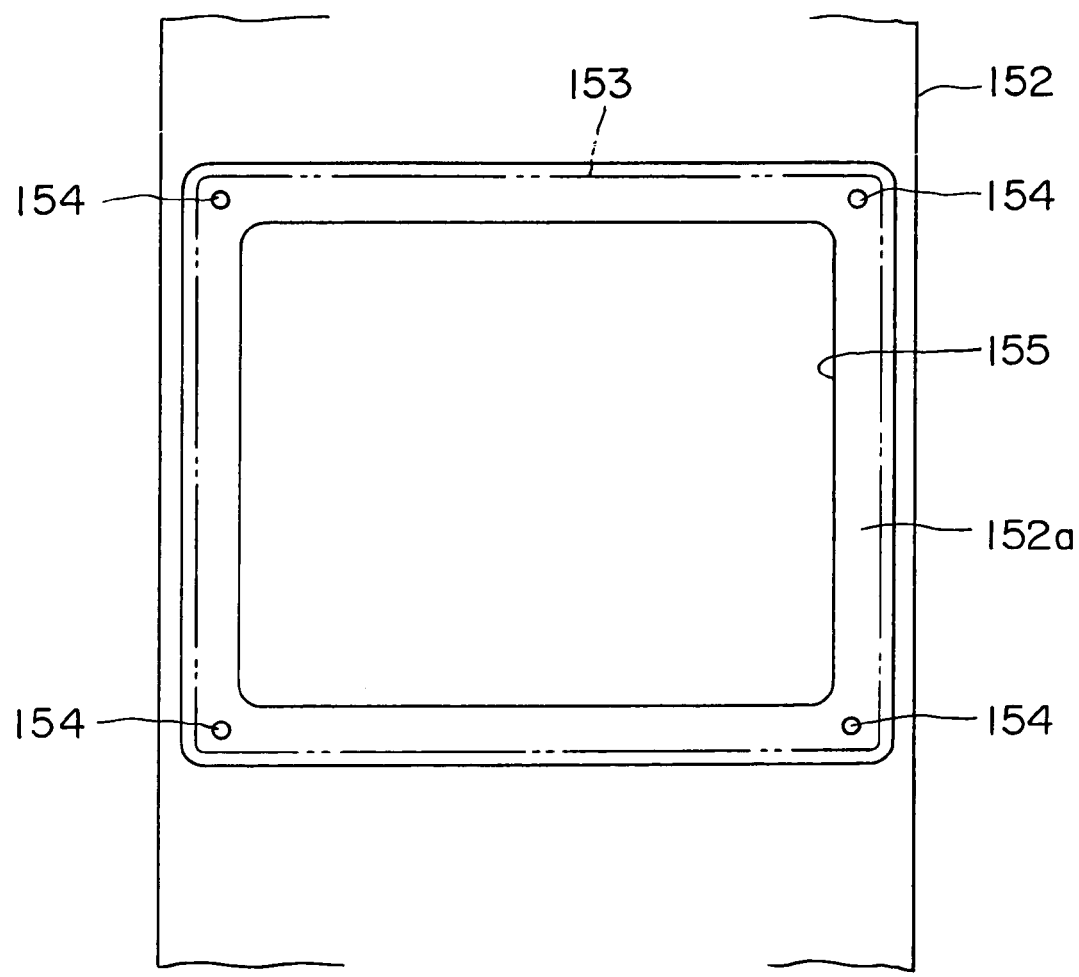
F I G. 34

MOUNTING/DEMOUNTING DEVICE FOR WAFER CARRIER LID

FIELD OF THE INVENTION

This invention relates to an attaching and removing unit for attaching and removing a lid of a wafer carrier placed on a loading-port unit.

BACKGROUND OF THE INVENTION

A loading-port unit is for conveying many wafers contained in a wafer carrier placed thereon to a semiconductor-device manufacturing unit.

As shown in FIG. 36, many wafers U are contained in a wafer carrier C, which is placed on a unit body 201 of a loading-port unit L. Each of the wafers U is adapted to be conveyed into a semiconductor-device manufacturing unit H by means of a robot unit 291. The loading-port unit L is provided with an attaching and removing unit for attaching and removing a lid 206 of the wafer carrier C. In FIG. 36, 292 represents a clean-air supplying unit, which is for supplying clean air into the semiconductor-device manufacturing unit H.

As an example of the attaching and removing unit of the lid 206, there is a structure shown in FIG. 37. In such a case of the attaching and removing unit 200, key elements 221 provided on a lid holding plate 215 are fitted into keyholes 222 of lock units E provided at the lid 206 of the wafer carrier C. Then, if the key elements 221 are pivoted in a predetermined direction, the lid 206 is locked or unlocked with respect to the wafer carrier C. When the lock units E of the lid 206 are unlocked, the lid 206 and the lid holding plate 215 are engaged with each other. In that state, the lid holding plate 215 is caused to move in a horizontal direction perpendicular to the lid 206. Thus, the lid 206 of the wafer carrier C is caused to move in the same direction while held by the lid holding plate 215, and hence removed from the wafer carrier C.

However, there may be a case wherein the lid 206 is not held by the lid holding plate 215, even if the attaching and removing unit 200 operates. For example, if a main part 221a (a part for being engaged with the keyhole 222) of the key element 221 is broken off, the key element 221 is pivoted only in vain even if the key element 221 is pivoted with it fitted into the keyhole 222, so that the lock unit E is never unlocked. In addition, similar is the case wherein a protrusion 218b of a disk plate 218, which forms the lock unit E, is broken off. In this case, the lid 206 remains attached to the wafer carrier C. If an arm (not shown) of the robot unit 291 is going to move into the wafer carrier C in order to convey the wafer U in the above state, the arm may interfere with the lid 206.

While the lid 206 is held by the lid holding plate 215 and temporarily put in a lower part of the loading-port unit L, if electric power supply is stopped because of a power failure or the like and then restarted, each key element 221 is returned to a starting-point thereof (to a lateral attitude thereof in this case). In the case, the engagement between the main part 221a of the key element 221 and the keyhole 222 of the lock unit E is released, and then the key element 221 is in a condition only inserted into the keyhole 222. Thus, there is a possibility that the lid 206 may fall.

SUMMARY OF THE INVENTION

This invention is intended to solve the above problems, and the object of this invention is to make it possible to detect whether the lid is held by the lid holding plate or not, and to cause the lid to be surely held by the lid holding plate.

This invention is an attaching and removing unit of a lid for a wafer carrier comprising: a lid holding plate that can move forward and backward relatively to a lid for a wafer carrier provided with a lock unit having a keyhole exposed outside, on a side of the keyhole; a driver for causing the lid holding plate to move forward and backward; and a key element protruding from the lid holding plate on a side of the lid in a pivotable manner, the key element disposed opposite the keyhole in a direction of the forward and backward movement: wherein the lock unit is adapted to be locked and unlocked by the key element pivoting in the keyhole; in a locked state, the key element can be inserted into and released from the keyhole; in an unlocked state, the key element is engaged with and can not be released from the keyhole, while the lid holding plate holds the lid; and the lid holding plate is provided with a lid-detecting unit for detecting whether the lid holding plate is holding the lid or not.

According to the invention, it can be detected whether the lid holding plate away from the wafer carrier is holding the lid or not. In other words, it can be detected whether the wafer carrier is opened or not. Then, only when the wafer carrier is opened, an arm of a robot unit moves into the wafer carrier. Thus, the arm never interferes with the lid.

For example, the lid-detecting unit has: a member to be detected whose position is changed dependently on whether the lid holding plate is holding the lid or not, and a detector that detects a position of the member to be detected.

Preferably, an attaching and removing unit further comprises: a controller that controls the key element in such a manner that a control of the key element for returning to a starting-point thereof is not conducted if the lid holding plate is holding the lid, based on an output of the lid-detecting unit, when electric power starts to be supplied. In the case, for example, even if the electric power supply is stopped because of a power failure and then restarted while the lid holding plate holds the lid, it can be prevented that the key element is returned to the starting-point thereof. Thus, it can be prevented that the engagement between the key element and the keyhole is released when the electric power supply is restarted. Thus, there is no possibility that the lid may fall.

In addition, preferably, a pushing member is provided on a surface of the lid holding plate on a side of the lid in such a manner that the pushing member can give a driving force to the lid in a direction of moving the lid away from the lid holding plate against the engagement of the key element and the keyhole. In the case, when the lid holding plate comes close to the lid and the key element provided on the lid holding plate is inserted into the keyhole of the lock unit, the pushing member presses the lid. Then, after the key element and the keyhole are engaged (unlocked state), the key element pulls the lid in an approaching direction and the pushing member pushes the lid in the opposite direction. Thus, the lid is held in a tensed state. Thus, the lid is held in a stable condition by the lid holding plate, so that a position of the key element may not be changed. In addition, the lid can be attached and removed, in a surely held condition without trembling.

More preferably, the pushing ember has a rubber member on a surface thereof on the side of the lid.

In addition, preferably, the wafer carrier is placed on a movable placing part that can move in the same directions as the forward and backward directions of the lid holding plate moved by the driver, and the movable placing part is connected to a second driver for causing the movable placing part to move, via a buffering member.

Alternatively, the invention is an attaching and removing unit of a lid for a wafer carrier comprising: a lid holding plate that can move forward and backward relatively to a lid for a wafer carrier provided with a lock unit having a keyhole exposed outside, on a side of the keyhole; a driver for causing the lid holding plate to move forward and backward; and a key element protruding from the lid holding plate on a side of the lid in a pivotable manner, the key element disposed opposite the keyhole in a direction of the forward and backward movement: wherein the lock unit is adapted to be locked and unlocked by the key element pivoting in the keyhole; in a locked state, the key element can be inserted into and released from the keyhole; in an unlocked state, the key element is engaged with and can not be released from the keyhole, while the lid holding plate holds the lid; and a pushing member is provided on a surface of the lid holding plate on a side of the lid in such a manner that the pushing member can give a driving force to the lid in a direction of moving the lid away from the lid holding plate against the engagement of the key element and the keyhole.

Preferably, the pushing member has a rubber member on a surface thereof on the side of the lid.

In addition, preferably, the lid holding plate is provided with a lid-detecting unit for detecting whether the lid holding plate is holding the lid or not.

In addition, preferably, the lid has a pin hole in a surface thereof on a side of the lid holding plate, and the lid holding plate has a positioning pin that protrudes from a surface thereof on a side of the lid, opposite the pin hole in the direction of the forward and backward movement.

For example, the pushing member is arranged around the positioning pin. In the case, preferably, the lid-detecting unit has: a member to be detected whose position is changed dependently on whether the lid holding plate is holding the lid or not, and a detector that detects a position of the member to be detected; and the member to be detected is arranged in the pushing member.

Alternatively, the pushing member is arranged around the key element. In the case too, preferably, the lid-detecting unit has: a member to be detected whose position is changed dependently on whether the lid holding plate is holding the lid or not, and a detector that detects a position of the member to be detected; and the member to be detected is arranged in the pushing member.

In addition, preferably, the wafer carrier is placed on a movable placing part that can move in the same directions as the forward and backward directions of the lid holding plate moved by the driver, and the movable placing part is connected to a second driver for causing the movable placing part to move, via a buffering member.

Alternatively, the invention is an attaching and removing unit of a lid for a wafer carrier comprising: a lid holding plate that can move forward and backward relatively to a lid for a wafer carrier provided with a lock unit having a keyhole exposed outside, on a side of the keyhole; a driving plate connected to the lid holding plate in a relatively movable manner, for causing the lid holding plate to move forward and backward; and a key element protruding from the driving plate through the lid holding plate on a side of the lid in a pivotable manner, the key element disposed opposite the keyhole in a direction of the forward and backward movement: wherein the lock unit is adapted to be locked and unlocked by the key element pivoting in the keyhole; in a locked state, the key element can be inserted into and released from the keyhole; and in an unlocked state, the key element is engaged with and can not be released from the keyhole, while the lid holding plate holds the lid.

Preferably, the lid holding plate is connected to the driving plate via a forcing member, the forcing member is adapted to push the lid holding plate toward the lid, against the engagement of the key element and the keyhole.

In addition, preferably, the lid holding plate is provided with a lid-detecting unit for detecting whether the lid holding plate is holding the lid or not.

In addition, preferably, the lid has a pin hole in a surface thereof on a side of the lid holding plate, and the lid holding plate has a positioning pin that protrudes from a surface thereof on a side of the lid, opposite the pin hole in the direction of the forward and backward movement.

In addition, preferably, a pushing member is provided on a surface of the lid holding plate on a side of the lid in such a manner that the pushing member can give a driving force to the lid in a direction of moving the lid away from the lid holding plate against forward and backward moving force of the lid holding plate to the lid by the driver. In the case, more preferably, the pushing member has a rubber member on a surface thereof on a side of the lid.

In addition, preferably, the wafer carrier is placed on a movable placing part that can move in the same directions as the forward and backward directions of the lid holding plate moved by the driver, and the movable placing part is connected to a second driver for causing the movable placing part to move, via a buffering member.

Alternatively, the invention is an attaching and removing unit of a lid for a wafer carrier comprising: a lid holding plate that can move forward and backward relatively to a lid for a wafer carrier provided with a lock unit having a keyhole exposed outside, on a side of the keyhole; a driver for causing the lid holding plate to move forward and backward; a key element protruding from the lid holding plate on a side of the lid in a pivotable manner, the key element disposed opposite the keyhole in a direction of the forward and backward movement; a movable placing part on which the wafer carrier is placed and which can move in the same directions as forward and backward directions of the lid holding plate moved by the driver; and a second driver connected to the movable placing part via a buffering member, for causing the movable placing part to move: wherein the lock unit is adapted to be locked and unlocked by the key element pivoting in the keyhole; in a locked state, the key element can be inserted into and released from the keyhole; and in an unlocked state, the key element is engaged with and can not be released from the keyhole, while the lid holding plate holds the lid.

BRIEF DESCRIPTION OF THE DRAWINGS

FIG. 14 is a side sectional view of a part including a pushing pin of FIG. 13;

FIG. 15 is an explanatory view of an operation of the part including the pushing pin of FIG. 13;

FIG. 23 is a sectional view taken along Y1—Y1 line of FIG. 22;

FIG. 24 is an explanatory view of an operation of the key unit $A_2$ of FIG. 22;

FIG. 27 is a similar view to FIG. 25, except that a rubber ring is further fitted;

FIG. 28 is a similar view to FIG. 26, except that a rubber ring is further fitted;

FIG. 30 is a view of the third embodiment according to the invention, similar to FIG. 3;

FIG. 31 is an explanatory view of a state wherein a wafer carrier C is pressed to a lid holding plate 77 in the third embodiment according to the invention;

FIG. 33 is an enlarged view of a main part of FIG. 32;

FIG. 34 is a schematic front view of an attaching plate when disk members made of resin are attached to four corner-portions of an attaching surface of the attaching plate;

DESCRIPTION OF THE PREFERRED EMBODIMENT

Figure 1:
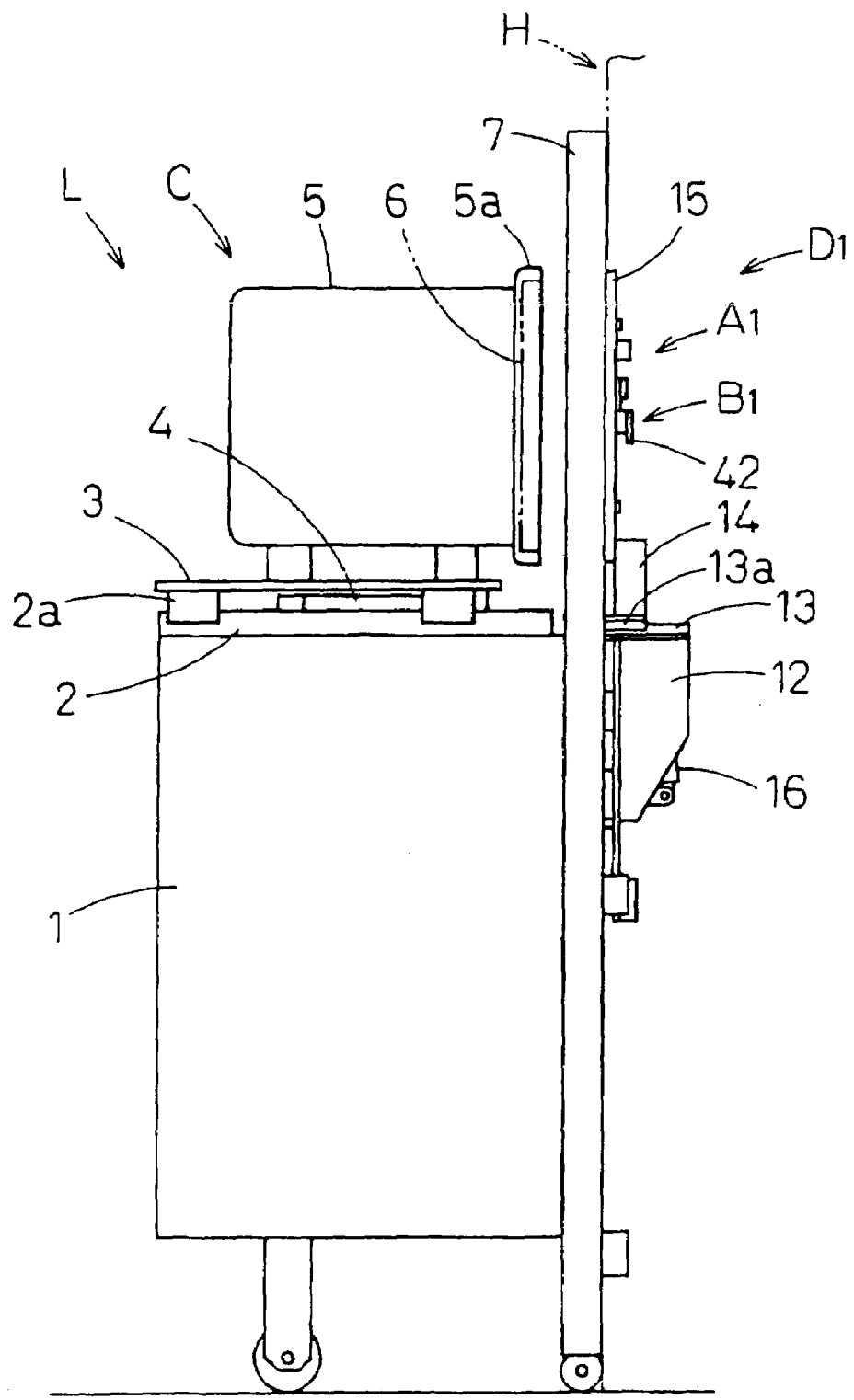
FIG. 1 is a side view of a loading-port unit L provided with an attaching and removing unit $D_1$ of a first embodiment according to the invention.
Figure 2:
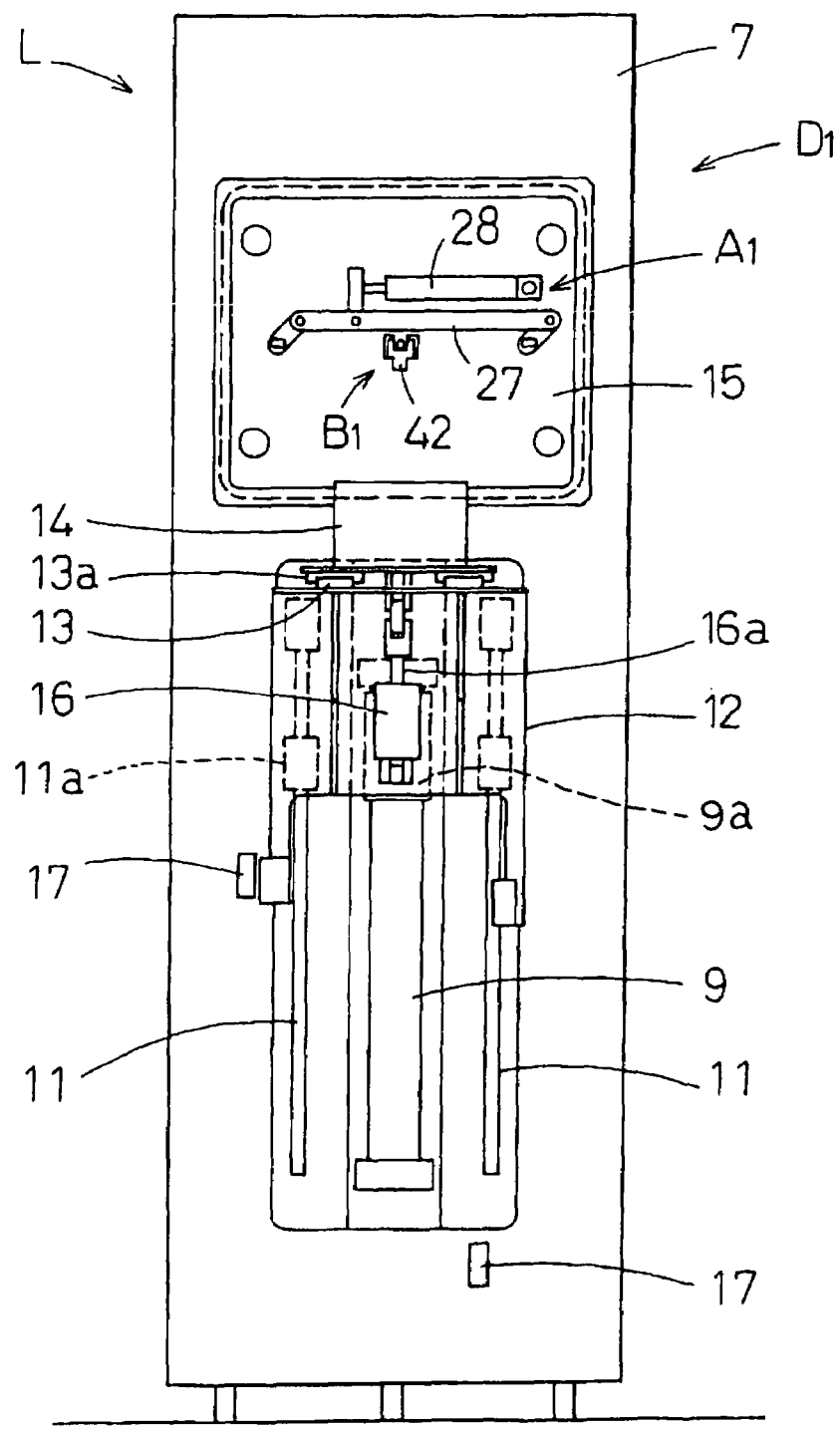
FIG. 2 is a backside view of the loading-port unit L of FIG. 1.
Figure 3:
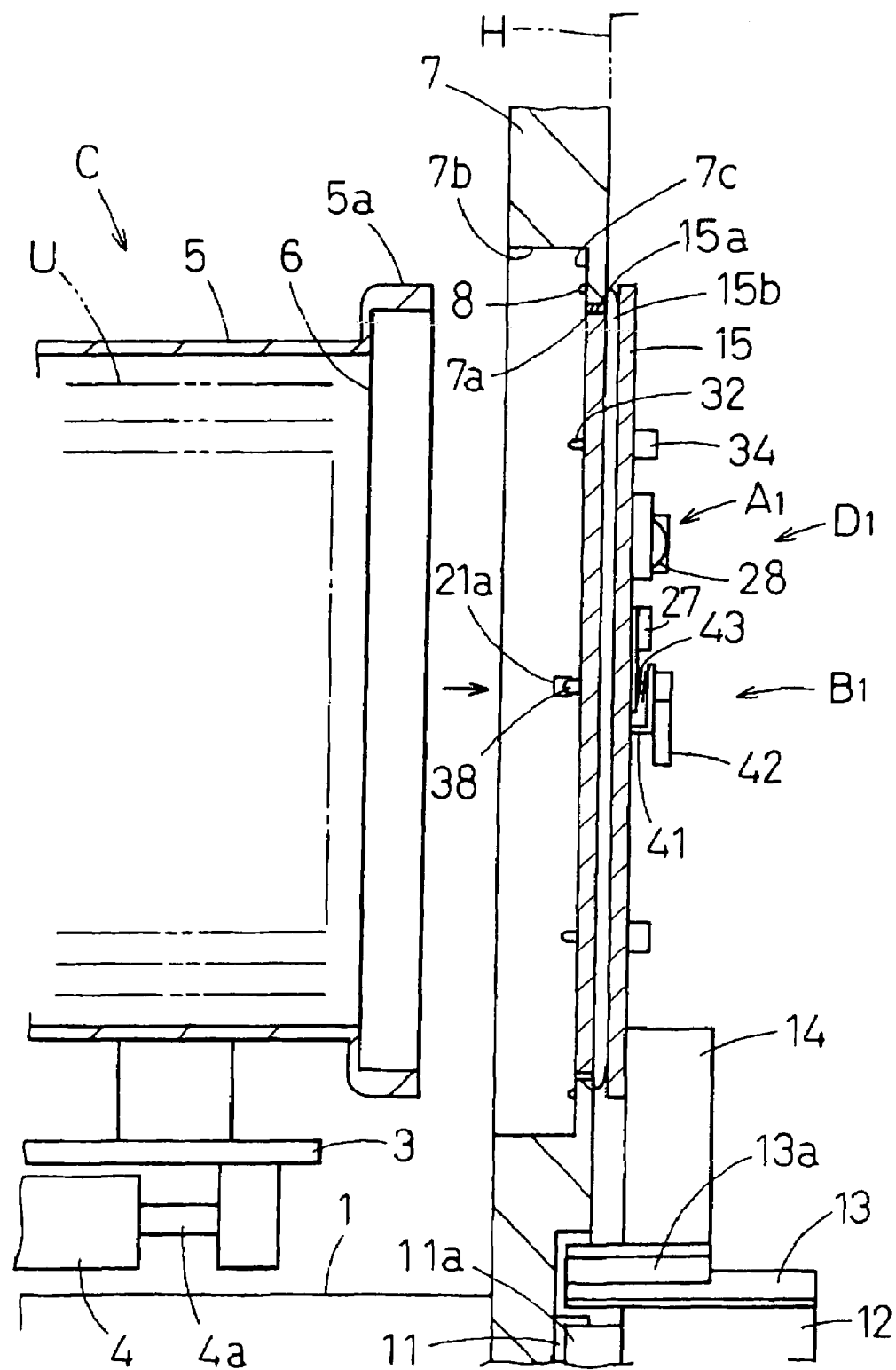
FIG. 3 is a side sectional view of a main part of the loading-port unit L of FIG. 1.

This invention is explained in more detail by giving some embodiments. At first, with reference to FIGS. 1 to 3, the whole structure of a loading-port unit L is explained. FIG. 1 is a side view of the loading-port unit L provided with an attaching and removing unit $D_1$ of a first embodiment according to the invention. FIG. 2 is a backside view of the same. FIG. 3 is a side sectional view of a main part of FIG. 1.

As described below, the attaching and removing unit $D_1$ of the first embodiment according to the invention mainly consists of lock units E provided on a lid 6 of a wafer carrier C, and a key unit $A_1$ and a lid detecting unit $B_1$ provided on a lid holding plate 15.

As shown in FIG. 1, guide rails 2 are arranged on an upper surface of a unit body 1 forming the loading-port unit L, in front- and rearward directions of the loading unit L. A carrier setting plate 3 for setting the wafer carrier C thereon is mounted on upper surfaces of guide members 2a attached to the guide rails 2. The carrier setting plate 3 is connected to a cylinder rod 4a of an air cylinder 4 (see FIG. 3), which is mounted on an upper surface of the unit body 1 in the front- and rearward directions of the loading-port unit L. When the air cylinder 4 is driven to operate, the wafer carrier C set on the carrier setting plate 3 can be caused to move in the same direction. A front part of a carrier body 5 that forms the wafer carrier C is provided with a lid attaching part 5a, which protrudes along and from an outside periphery of the front part. The lid attaching part 5a is closed by the lid 6.

The wafer carrier C is fixed to the carrier setting plate 3 by fitting a protrusion provided on the carrier setting plate 3 into a recess portion in a lower surface of the wafer carrier.

An attaching plate 7 is mounted at a rear part of the unit body 1 of the loading-port unit L, which part is to be fixed to a semiconductor-device manufacturing unit H. The loading-port unit L is fixed by the attaching plate 7 being fastened to the semiconductor-device manufacturing unit H in a close contact. As shown in FIG. 3, an upper portion of the attaching plate 7 has an opening consisting of a small opening part 7a and a large opening part 7b. The small opening part 7a is provided in such a manner that wafers U contained in the wafer carrier C are conveyed therethrough. The large opening part 7b is provided in such a manner that the lid attaching part 5a of the wafer carrier C is inserted thereinto. A packing member 8 is attached to a step part 7c between the small opening part 7a and the large opening part 7b, along a periphery of the step part 7c. When the packing member 8 is in a close contact with the lid attaching part 5a of the wafer carrier C, airtightness between the outside and the inside of the wafer carrier C can be assured.

In addition, as shown in FIGS. 2 and 3, a rod-less cylinder 9 is arranged on a backside part of the unit body 1 of the loading-port unit L in a vertical direction. A pair of guide rails 11 are arranged in the vertical direction on both sides of the rod-less cylinder 9. Guide members 11a are attached to each of the guide rails 11. A bracket 12 is fixed to a movable body 9a of the rod-less cylinder 9 and the guide members 11a. When the rod-less cylinder is driven to operate, the bracket 12 is vertically moved. The attaching plate 7 has a through hole, which allows the movable body 9a to move therethrough.

Two guide rails 13 are arranged on an upper surface of the bracket 12, in the front- and rearward direction of the loading-port unit L. A guide member 13a is attached to each of the guide rails 13. A lid holding plate 15 is mounted on upper surfaces of the respective guide members 13a via a block member 14.

The lid holding plate 15 has a flat shape, is a little larger than the lid 6 of the wafer carrier C, and is arranged to face the lid 6. In addition, the lid holding plate 15 can move in the front- and rearward direction of the loading-port unit L, by means of an air cylinder 16 arranged in a substantially vertical direction of the bracket 12 and a link mechanism mounted on a tip part of a cylinder rod 16a of the air cylinder 16. In FIG. 2, 17 represent switches for detecting an upper stroke end and a lower stroke end of the bracket 12.

As shown in FIG. 3, a step part 15a is formed in the lid holding plate 15 (the shaded portion) on a side of the wafer carrier C. A circular packing member 15b is arranged onto an outside periphery of the step part 15a. When the air cylinder 16 (see FIG. 2) is driven to operate, via the link mechanism mounted on the tip part of the cylinder rod 16a thereof, the lid holding plate 15 moves toward the wafer carrier C, so that the step part 15a is inserted into the small opening part 7a of the attaching plate 7. At that time, the small opening part 7a is closed by the packing member 15b arranged onto the step part 15a of the lid holding plate 15. Thus, airtightness between the outside and the inside of the semiconductor-device manufacturing unit H can be assured.

Figure 4:
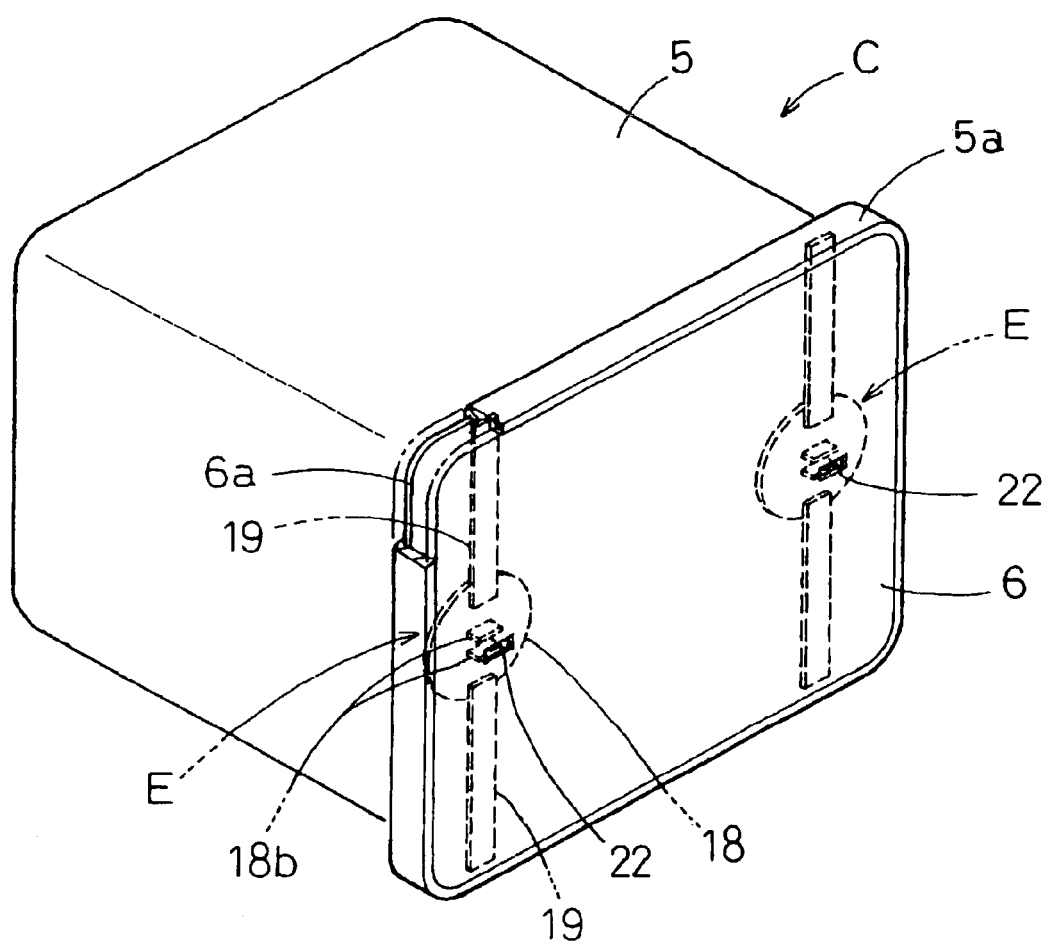
FIG. 4 is a perspective view of a wafer carrier C of FIG. 1.
Figure 5:
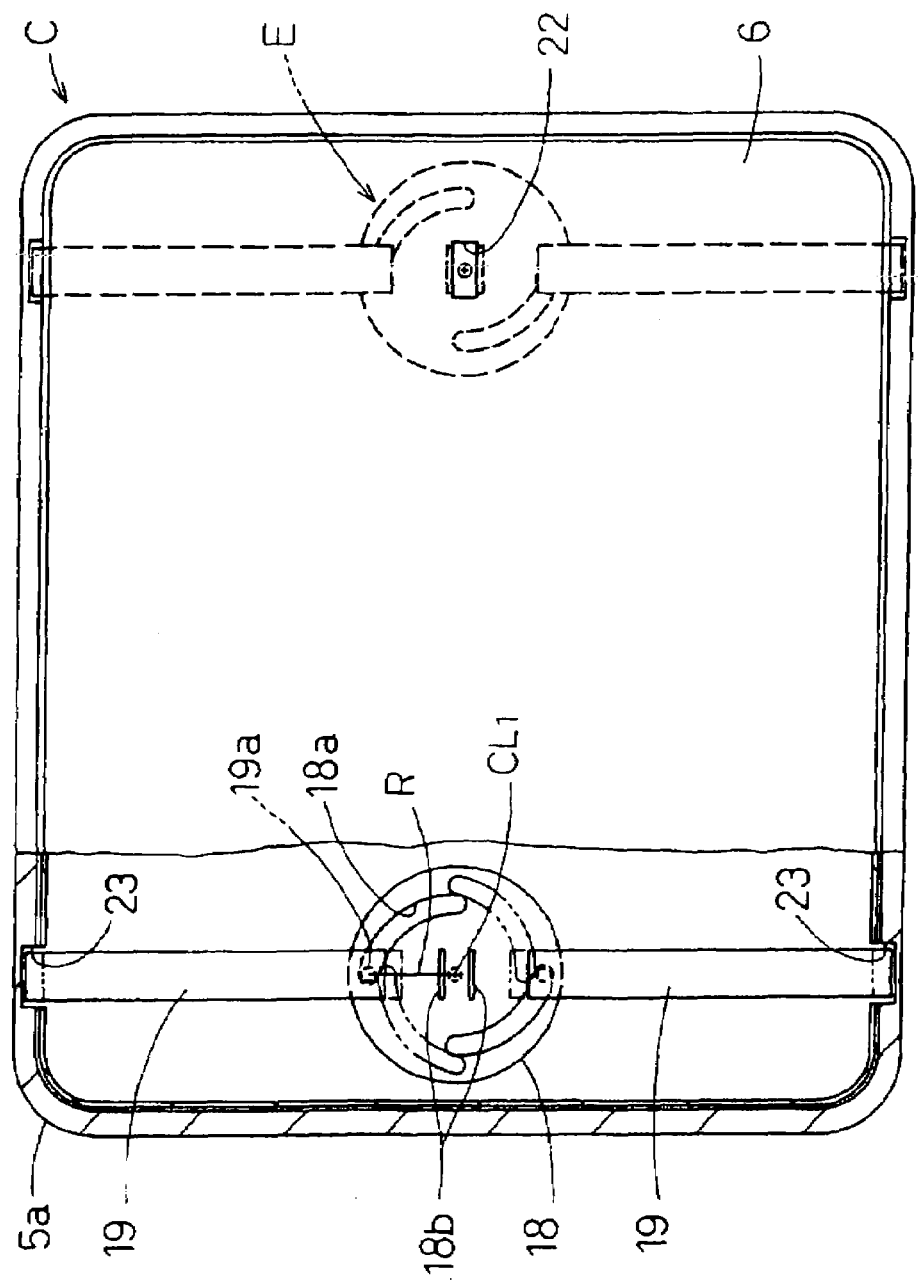
FIG. 5 is a front view of the wafer carrier C of FIG. 1, in which lock units E of the wafer carrier C are locked.
Figure 6:
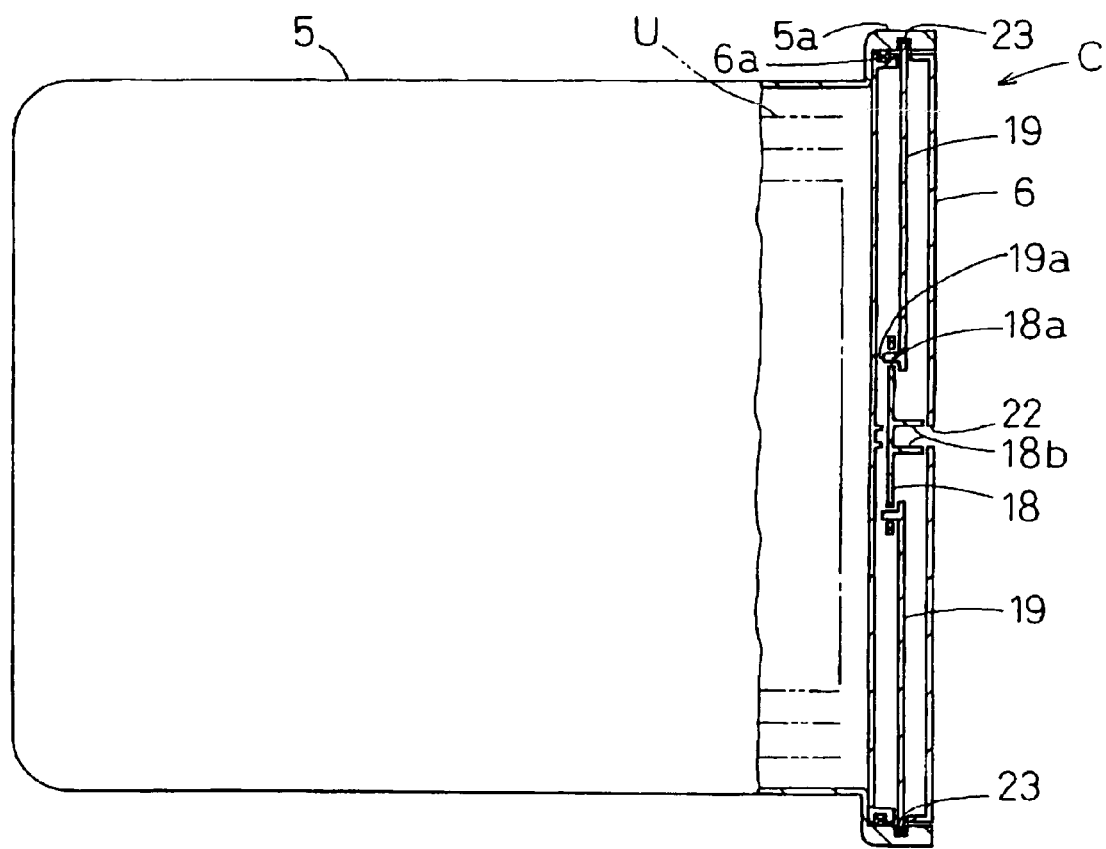
FIG. 6 is a side view of the wafer carrier C of FIG. 1, in which a part of the wafer carrier C are broken off.

Next, with reference to FIGS. 4 to 6, the wafer carrier C of the embodiment is explained. FIG. 4 is a perspective view of the wafer carrier C. FIG. 5 is a front view of the wafer carrier C wherein the lock units E are locked. FIG. 6 is a side view of the same wherein a part of the wafer carrier C is broken off.

As shown in FIGS. 4 to 6, the lid attaching part 5a is formed at the front part of the carrier body 5 that forms the wafer carrier C, and the lid 6 is attached to the lid attaching part 5a. A packing member 6a is arranged along the whole of outside periphery of the lid 6. When the packing member 6a comes into close contact with an inside surface of the lid attaching part 5a, airtightness between the inside and the outside of the wafer carrier C can be assured. Thus, clean atmosphere in the wafer carrier C can be maintained. A pair of lock units E is arranged in the lid 6 at both side portions in a width direction thereof.

Figure 7:
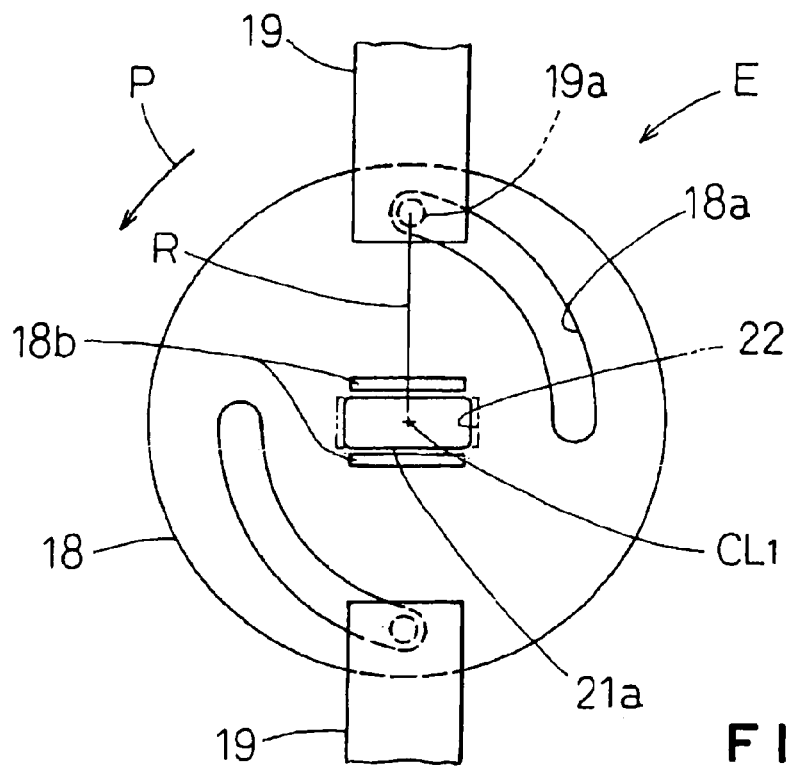
FIGS. 7 and 8 are front views of the wafer carrier C of FIG. 1, in which a main part 21a of a key element 21 is inserted into a keyhole 22 of the lock unit E and in which the key element 21 is pivoted, respectively.
Figure 8:
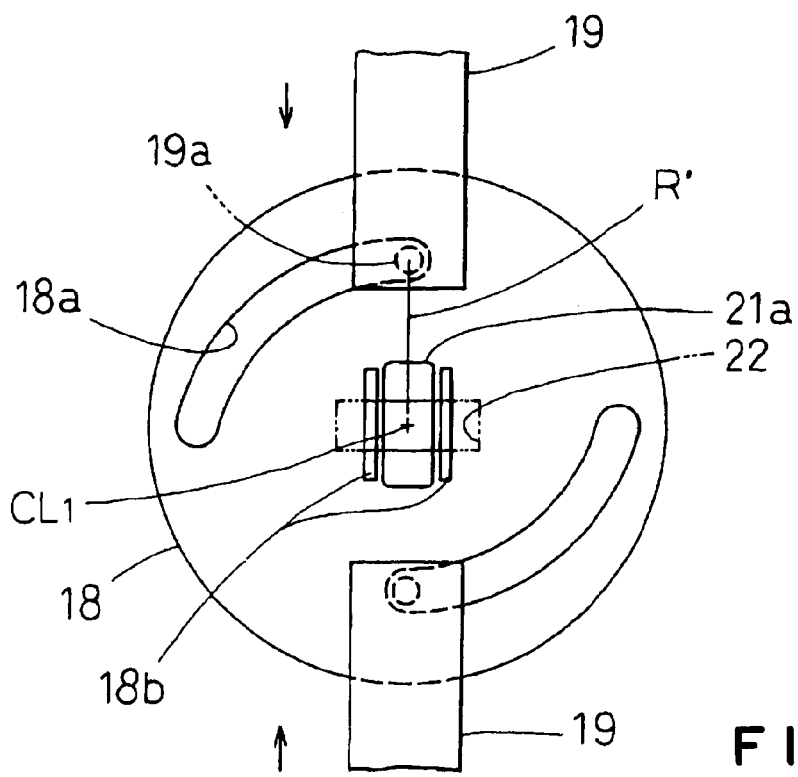
Figure 9:
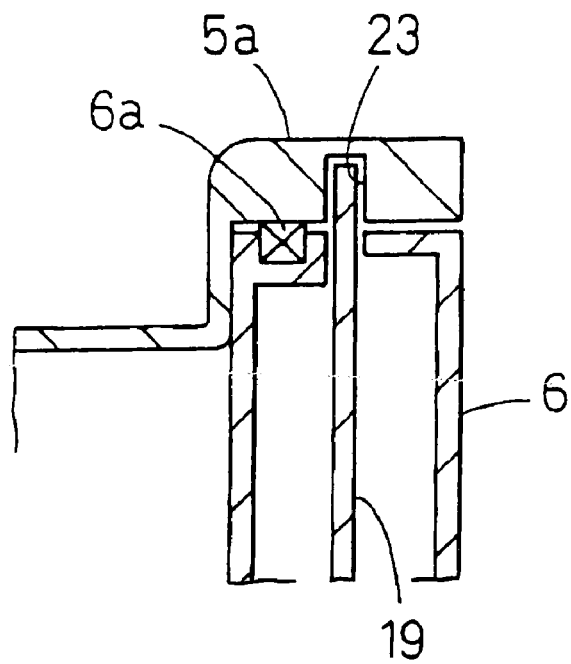
FIG. 9 is a side sectional view of an engagement hole 23 of a lid-attaching part 5a, in which a lock plate 19 is fitted in the engagement hole 23.
Figure 10:
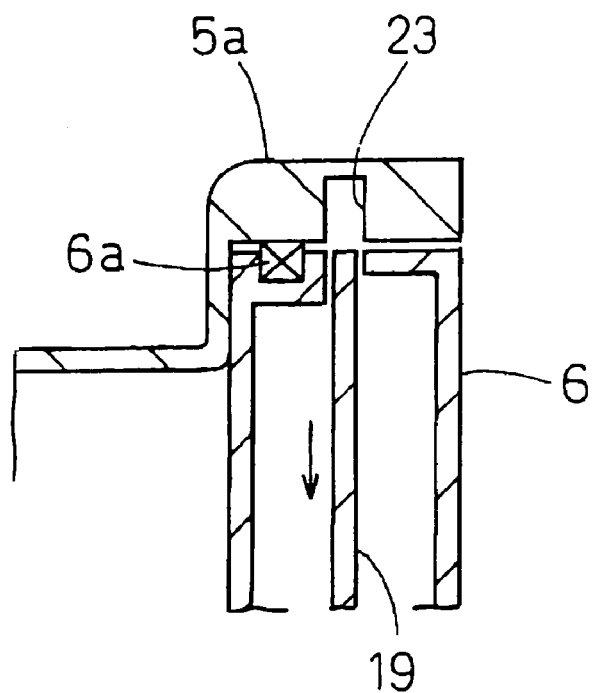
FIG. 10 is a side sectional view of the engagement hole 23 of the lid-attaching part 5a, in which the lock plate 19 is released from the engagement hole 23.

Next, the lock unit E is explained. As shown in FIGS. 4 and 5, each lock unit E has a structure wherein two lock plates 19 are respectively mounted in a vertically movable manner at an upper part and a lower part of a circular disk plate 18, which is arranged at a substantially central portion in a vertical direction of the lid 6 pivotably around a center axis CL1 thereof. As shown in FIGS. 5, 7 and 8, each disk 18 has a pair of groove-cams 18a, each of which is formed in a circumferential direction thereof through about 90 degrees. A cam radius R of the groove-cam 18a is not constant, but becomes smaller along the circumferential direction of the disk 18. Then, a connecting pin 19a attached to a base end portion of the lock plate 19 (an end portion on a side of the disk 18) is fitted into the groove-cam 18a. The connecting pin 19a is movable in the groove-cam 18a.

A pair of protrusions 18b are arranged on a front surface of the disk 18. The pair of protrusions 18b are substantially horizontal in a state wherein the lock unit E is locked. Then, in the lid 6, a keyhole 22 through which a main part 21a of a key element 21 forming the key unit $A_1$ (see FIG. 11) is inserted into the inside of the lid 6 is formed at a portion corresponding to between the pair of protrusions 18b. As described below, the main part 21a of the key element 21 can be inserted into the keyhole 22 always with a horizontal position thereof. Thus, the keyhole 22 has a lateral rectangular shape that is a little larger than that of the main part 21a of the key element 21 in a front view thereof.

As shown in FIG. 6, the lock unit E has a structure wherein tip portions of the upper and lower lock plates 19 are fitted into fitting holes 23 formed in the lid attaching part 5a of the carrier body 5 in order to lock the lock unit E.

With reference to FIGS. 7 to 10, an operation to unlock the lock unit E is explained. The key element 21 inserted into the inside of the lid 6 through the keyhole 22 goes into between the pair of protrusions 18b. Then, when the key element 21 is pivoted in a direction shown by an arrow P, via the pair of protrusions 18b, the disk 18 is pivoted in the same direction around the center axis $CL_1$. When the disk 18 is pivoted in the direction shown by the arrow P, the distance between the connecting pin 19a and the center axis $CL_1$ gradually becomes smaller to a cam radius R' (see FIG. 8), so that the base end portions of the upper and lower lock plates 19 come close to each other. Then, the tip portions of the upper and lower lock plates 19 are released from the fitting holes 23 provided in the lid attaching part 5a, so that the lock unit E is unlocked.

On the contrary, when the key element 21 is pivoted in a direction opposite to that shown by the arrow P, the lock unit E can be locked again.

Figure 11:
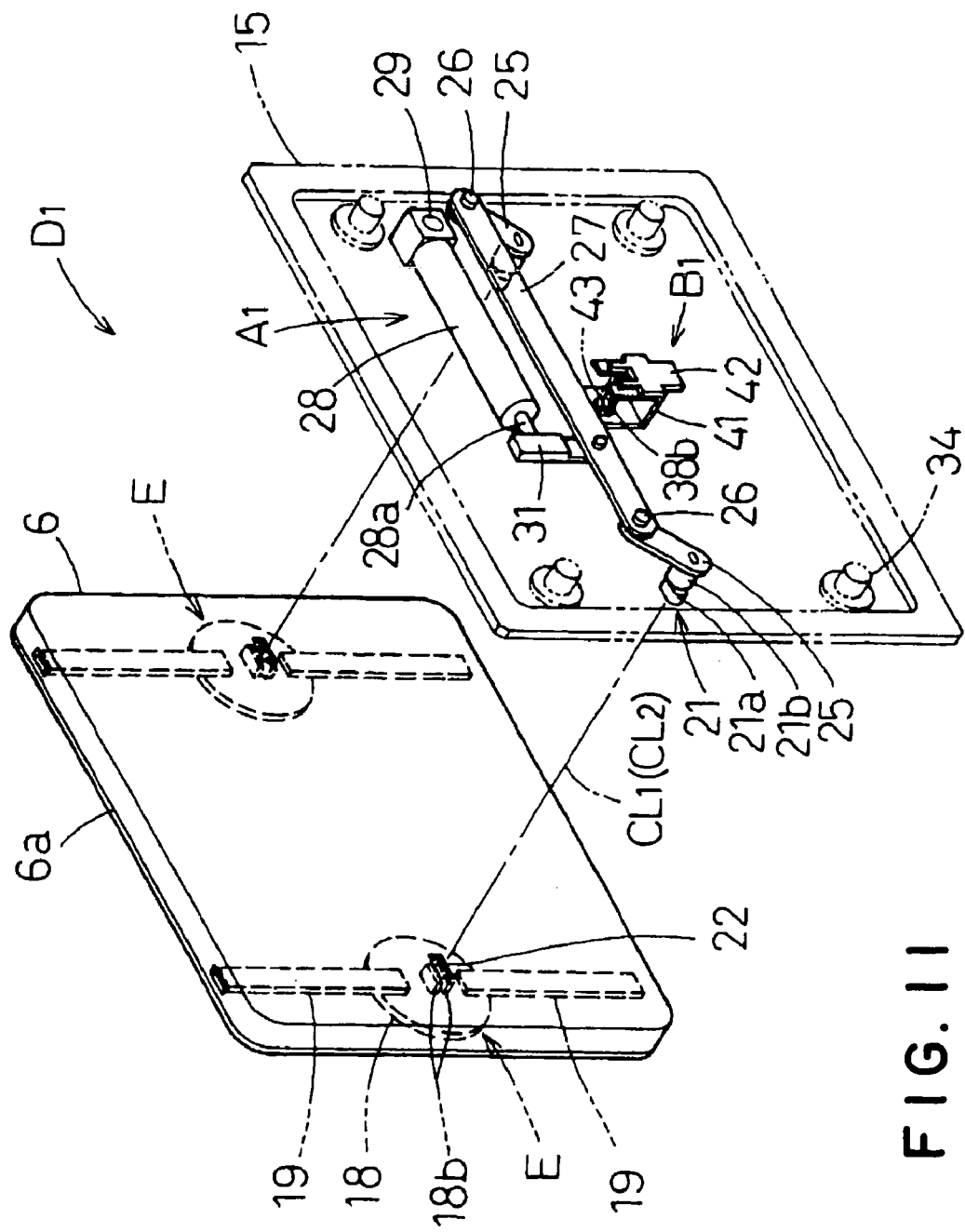
FIG. 11 is a perspective view of the attaching and removing unit $D_1$ of FIG. 1.
Figure 12:
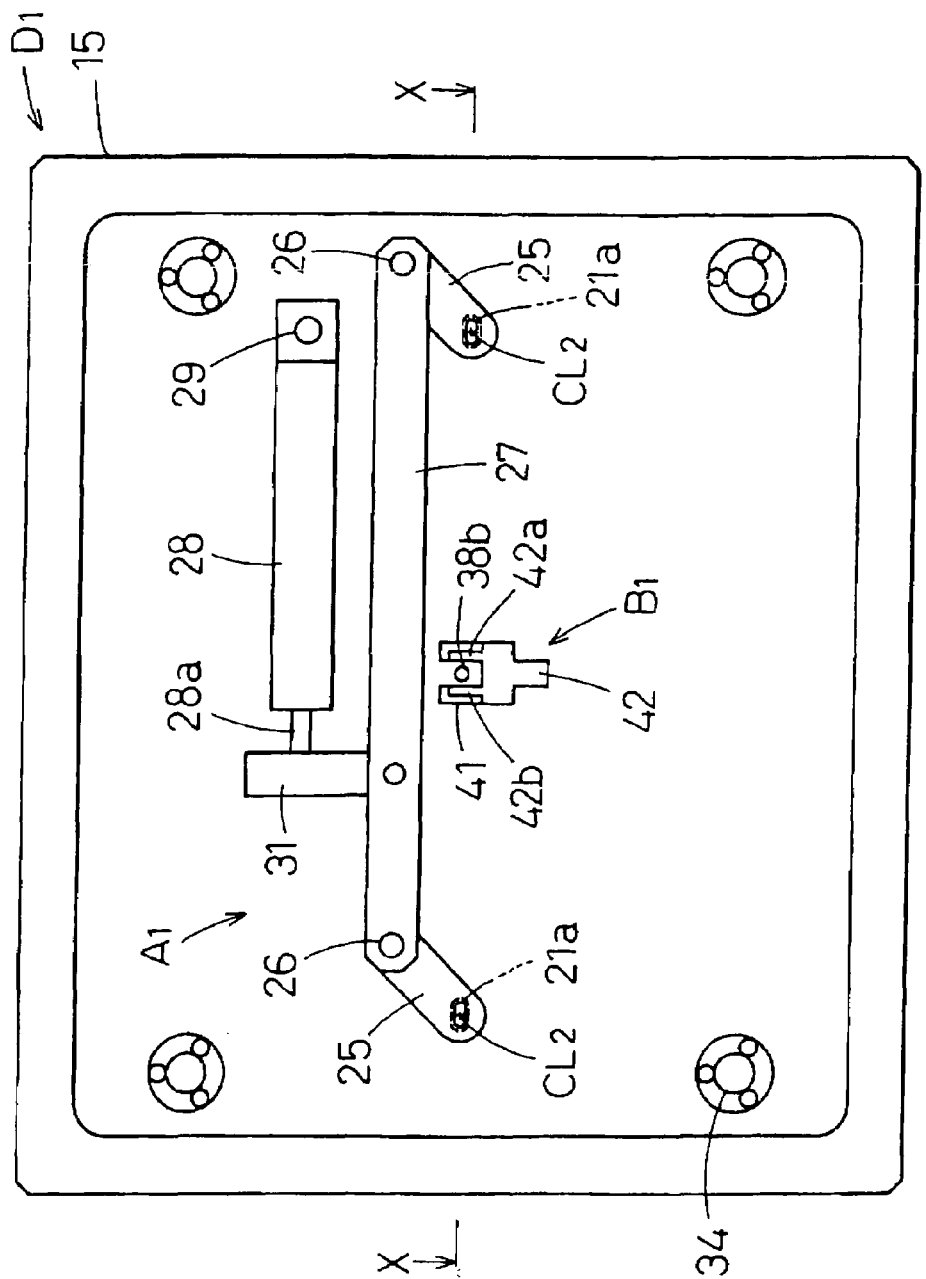
FIG. 12 is a backside view of a key unit $A_1$ and a lid-detecting unit $B_1$ of FIG. 1.
Figure 13:
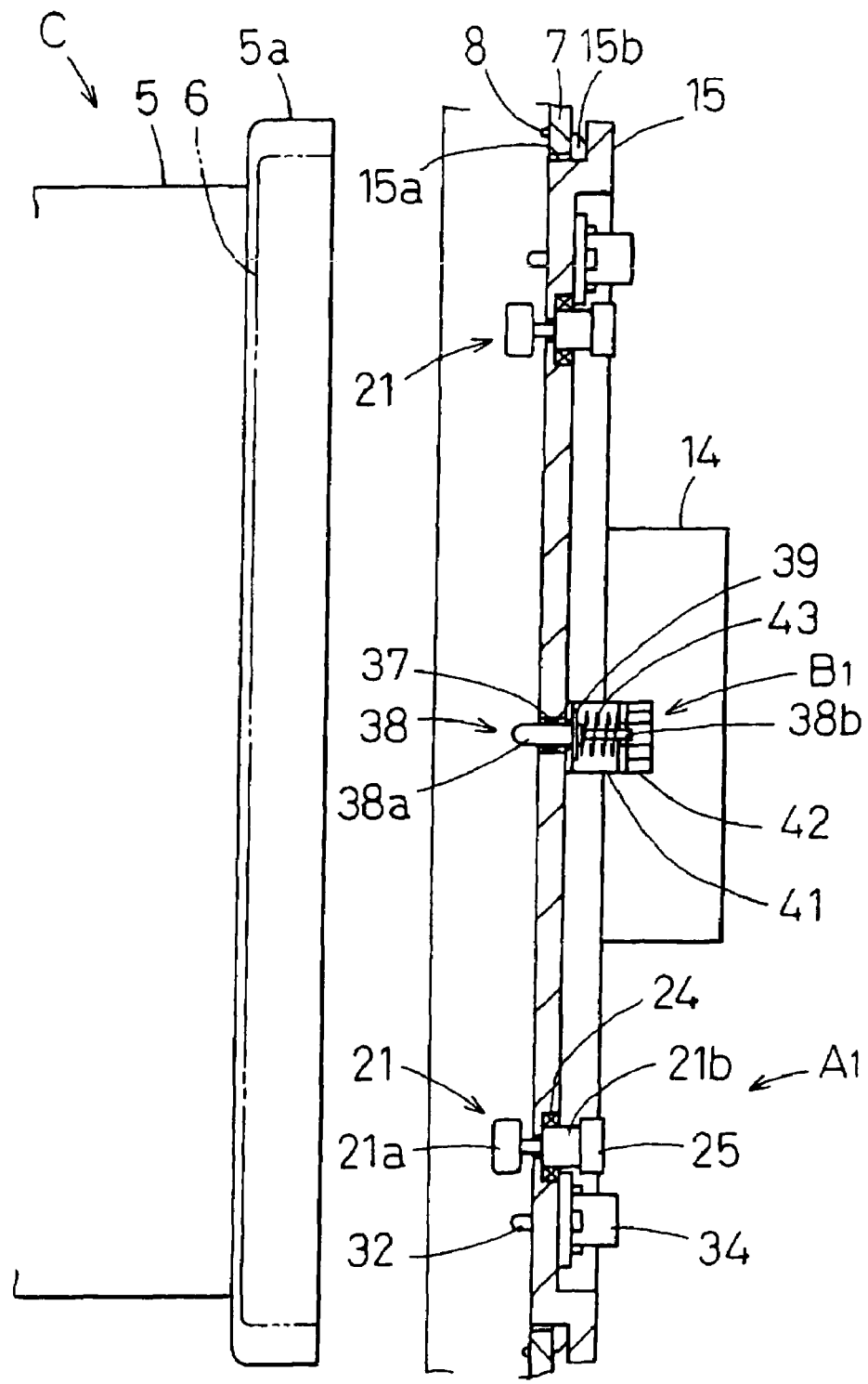
FIG. 13 is a sectional view taken along X—X line of FIG. 12.

Next, the key unit $A_1$ and the lid detecting unit $B_1$ are explained. FIG. 11 is a perspective view of the attaching and removing unit $D_1$ of the first embodiment. FIG. 12 is a backside view of the key unit $A_1$ and the lid-detecting unit $B_1$ of the first embodiment. FIG. 13 is a sectional view taken along X—X line of FIG. 12. FIG. 14 is a side sectional view of a part including a pushing pin 32.

As shown in FIG. 11, a main part of the key unit $A_1$ is provided at an upper portion of the lid holding plate 15 on a side facing the semiconductor-device manufacturing unit H. The lid-detecting unit $B_1$ is provided at a substantially central portion thereof on the same side.

At first, the key unit $A_1$ is explained. As shown in FIGS. 11 to 13, the main parts 21a of the pair of key elements 21, which form the key unit $A_1$, protrude from the lid holding plate 15 toward the lid 6 of the wafer carrier C to face the pair of keyholes 22. Each pivoting shaft 21b of each key element 21 is supported by a bearing 24 set in the lid holding plate 15. Thus, each key element 21 can be pivoted around a center axis $CL_2$ thereof. The main part 21a of the key element 21 has a lateral rectangular shape a little smaller than that of the keyhole 22, and is positioned horizontally in a normal state.

Lower end portions of a pair of link plates 25 are attached to respective rear end portions of the pivoting shafts 21b of the pair of key elements 21. Upper end portions of the pair of link plates 25 are pivotably connected to a connecting plate 27 via connecting pins 26. The pair of link plates 25 are connected in a substantially parallel state with respect to each other via the connecting plate 27, so that a parallel link mechanism is formed. Thus, when the connecting plate 27 is caused to move in an arc, the pair of link plates 25 is caused to move in a crank motion around the center axis $CL_2$ of each key element 21. Thus, the pair of key elements 21 is synchronously pivoted in the same direction and only through a predetermined angle. The predetermined angle is substantially the same as the angle of the groove-cam 18a in each disk 18, which forms the lock unit E, and is about 90 degrees.

The crank motion can be carried out by a single air cylinder 28. In the case, the air cylinder 28 is arranged above the connecting plate 27 on the backside of the lid holding plate 15, in a parallel direction with the board surface of the lid holding plate 15. A rear end portion of the air cylinder 28 is supported by a fulcrum pin 29 perpendicularly attached to the lid holding plate 15 on the side facing the semiconductor-device manufacturing unit H. Thus, the air cylinder 28 can be pivoted around the fulcrum pin 29 in a vertical plane parallel to the lid holding plate 15. In addition, a cylinder rod 28a thereof is connected to the connecting plate 27 via a connecting block 31 in such a manner that the cylinder rod 28a is arranged substantially horizontally with respect to the connecting plate 27.

When the air cylinder 28 is driven to operate, the cylinder rod 28a goes in and out. The air cylinder 28 is pivoted up and down around an axis of the fulcrum pin 29, so that the connecting plate 27 is caused to move in an arc. Then, the respective key elements 21 are synchronously pivoted around the respective center axes $CL_2$ in the same direction through the predetermined angle, via the pair of link plates 25.

A plurality of (in the embodiment, four) pushing pins 32 are arranged on the lid holding plate 15, in order to hold the lid 6 in a more stable manner when attaching or removing the lid 6. Then, the pushing pin 32 is explained.

As shown in FIGS. 12 to 15, the four pushing pins 32 are arranged in vicinities of four corners of the lid holding plate 15. The pushing pins 32 are inserted through respective pushing-pin inserting holes 33, which are formed in the front- and rearward direction of the loading-port unit L. The pushing pins 32 are made of resin. Each pushing pin 32 consists of: a main part 32a whose tip portion has a substantially spindle shape; and a guide part 32b having an outside diameter larger than an inside diameter of the pushing-pin inserting hole 33. The tip portion of the main part 32a is inserted from the side of the semiconductor-device manufacturing unit H of the lid holding plate 15, through the pushing-pin inserting hole 33.

A spring receiver tube 34 is attached to the lid holding plate 15 on the side of the semiconductor-device manufacturing unit H, correspondingly to each pushing-pin inserting hole 33. The spring receiver 34 has a bottom and a cylindrical shape, and functions to support the pushing pin 32 and to prevent the pushing pin 32 from falling. That is, the guide part 32b of the pushing pin 32 is arranged in the inside of the spring receiver 34. In addition, a compressed spring 35 is arranged (fitted) between the guide part 32b of the pushing pin 32 and the bottom of the spring receiver 34. Thus, the pushing pin 32 is forced to a position wherein the main part 32a protrudes from the lid holding plate 15 toward the wafer carrier C.

Figure 16:
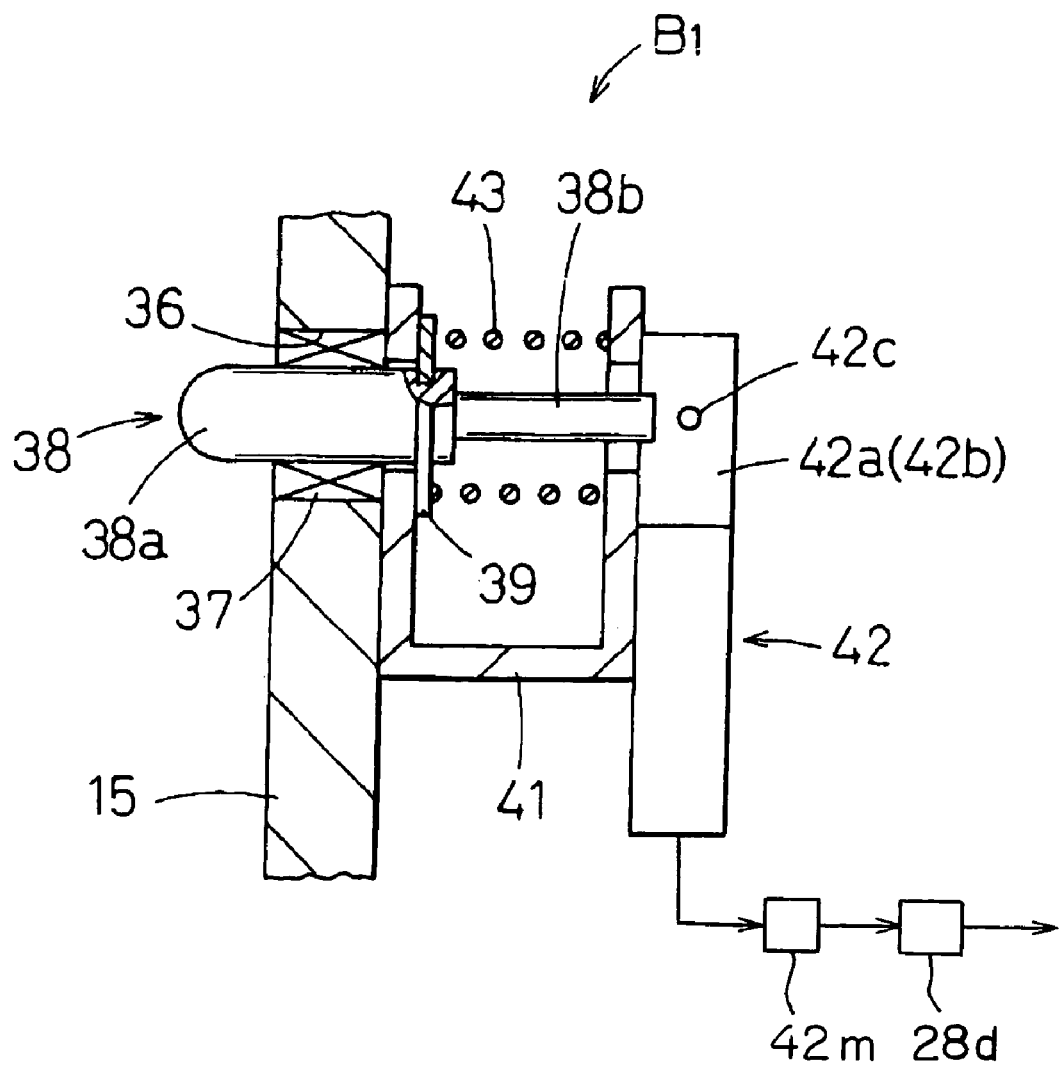
FIG. 16 is a side sectional view of the lid-detecting unit $B_1$ of FIG. 13.
Figure 17:
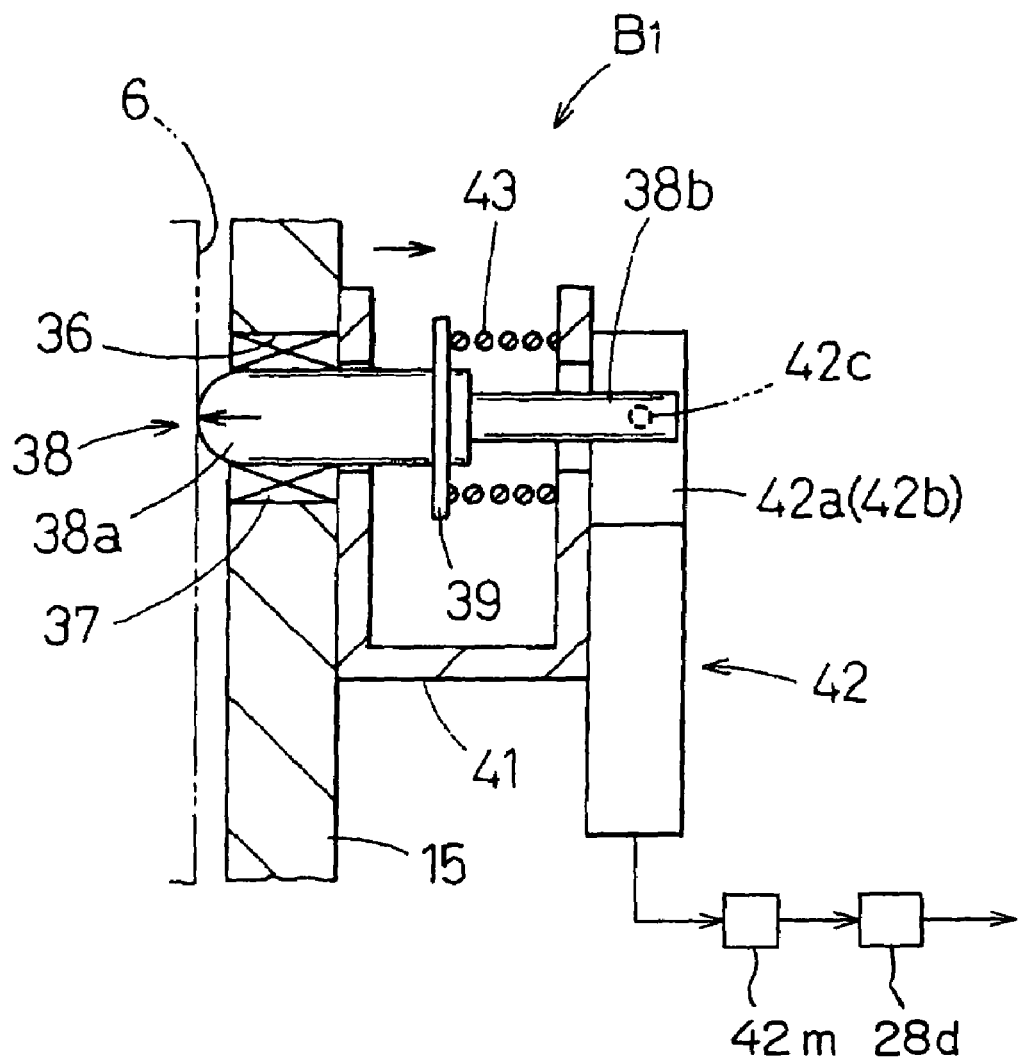
FIG. 17 is an explanatory view of an operation of the lid-detecting unit $B_1$ of FIG. 13.

Next, the lid-detecting unit $B_1$ is explained. As shown in FIGS. 12, 16 and 17, a through hole 36 is formed at a substantially central portion of the lid holding plate 15 in the front- and rearward direction of the loading-port unit L. A bearing 37 is set in the through hole 36. A detecting pin 38 is movably inserted in the bearing 37. The detecting pin 38 is a shaft member with a step, that is, has a main part 38a that is pressed by the lid 6, and a detecting-rod part 38b arranged coaxially with the main part 38a. A tip portion of the main part 38a has a hemisphere shape. A spring-receiving ring 39, which has a disk-like shape larger than an outside diameter of the main part 38a, is attached to a rear end portion of the main part 38a. An optical sensor 42 is fixed to the lid holding plate 15 on the side of the semiconductor-device manufacturing unit H, correspondingly to the through hole 36, via a bracket 41 having a substantially U-like shape in a side view thereof. An upper part of the optical sensor 42 forks into two parts, that is, a ray-emitting part 42a and a ray-receiving part 42b are provided. A ray 42c such as an visible ray, an ultraviolet ray, an infrared ray or the like is always emitted from the ray-emitting part 42a toward the ray-receiving part 42b. When the ray 42c is interrupted by an object to be detected (in the case, the detecting-rod part 38b), a detecting signal is adapted to be outputted. In addition, a compressed spring 43 is fitted around the detecting-rod part 38b of the detecting pin 38. The compressed spring 43 is supported by the spring-receiving ring 39 and the bracket 41. Thus, the detecting pin 38 is forced to the side of the wafer carrier C.

Next, an operation of the attaching and removing unit $D_1$ of the embodiment is explained.

As shown in FIG. 3, since the packing member 15b of the lid holding plate 15 is pressed to the attaching plate 7 of the loading-port unit L, the semiconductor-device manufacturing unit H is maintained in a sealed state. A predetermined number of wafers U is contained in the wafer carrier C, and the lock units E provided in the lid 6 are locked.

Figure 18:
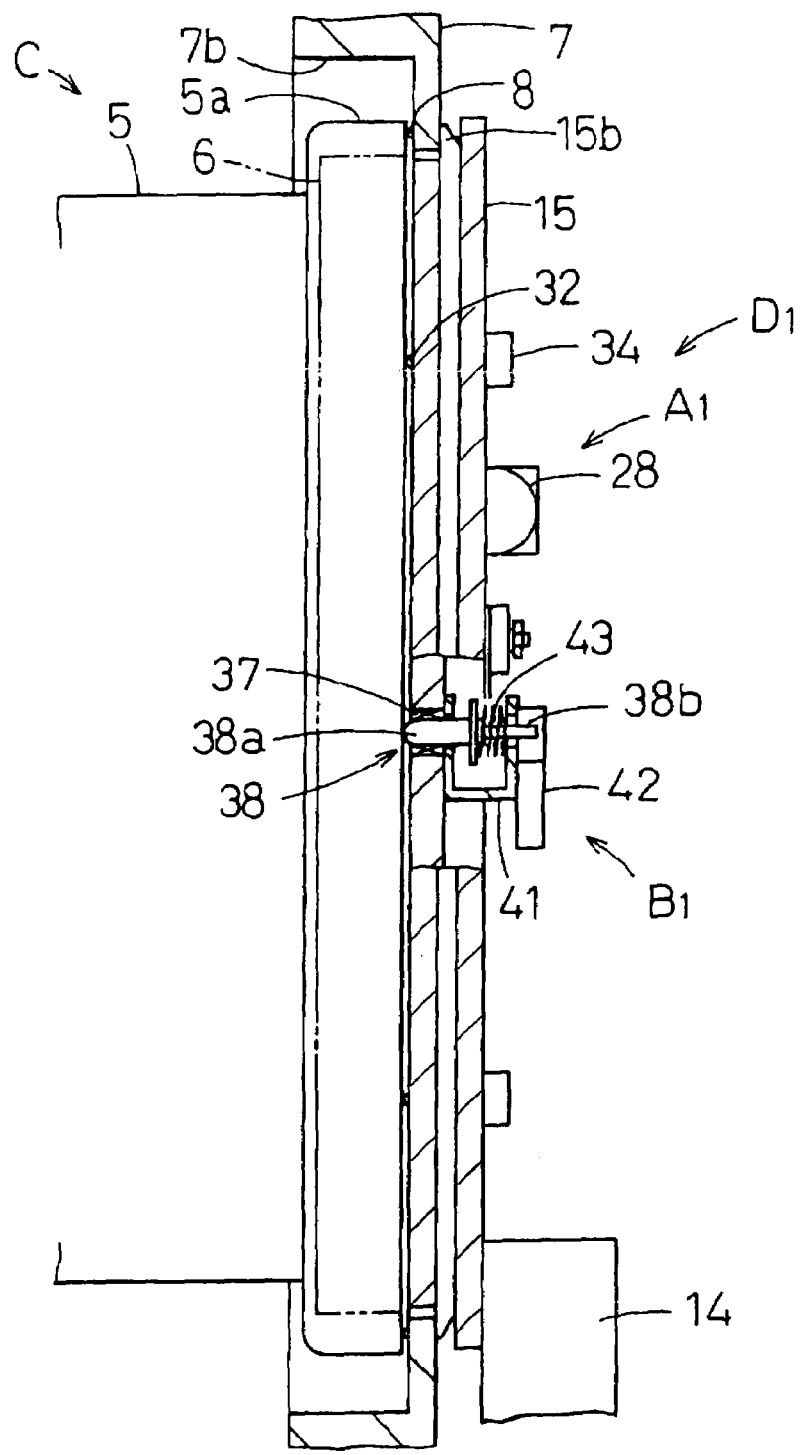
FIG. 18 is a similar view to FIG. 3, for explaining a state wherein the wafer carrier C is pressed to an attaching plate 7.

In that state, the air cylinder 4 is driven to operate, in order to cause the wafer carrier C to move toward the side of the semiconductor-device manufacturing unit H. As shown in FIG. 11, the main parts 21a of the pair of key elements 21 provided on the lid holding plate 15 relatively go into the inside of the lid 6 through the facing keyholes 22. When the lock units E are locked, the keyholes 22 and the protrusions 18b are arranged in their horizontal positions that match the main parts 21a of the key elements 21. In addition, the center axis CL1 of the element 21 and the center axis CL2 of the keyhole 22 coincide with each other. Thus, the main parts 21a of the pair of key elements 21 smoothly go into between the protrusions 18b. At the same time, the respective pushing pins 32 and the detecting pin 38 are pressed against the lid 6, and they move backward against elastic force of the respective compressed springs 35 and 43. That state is shown in FIG. 18.

Figure 19:
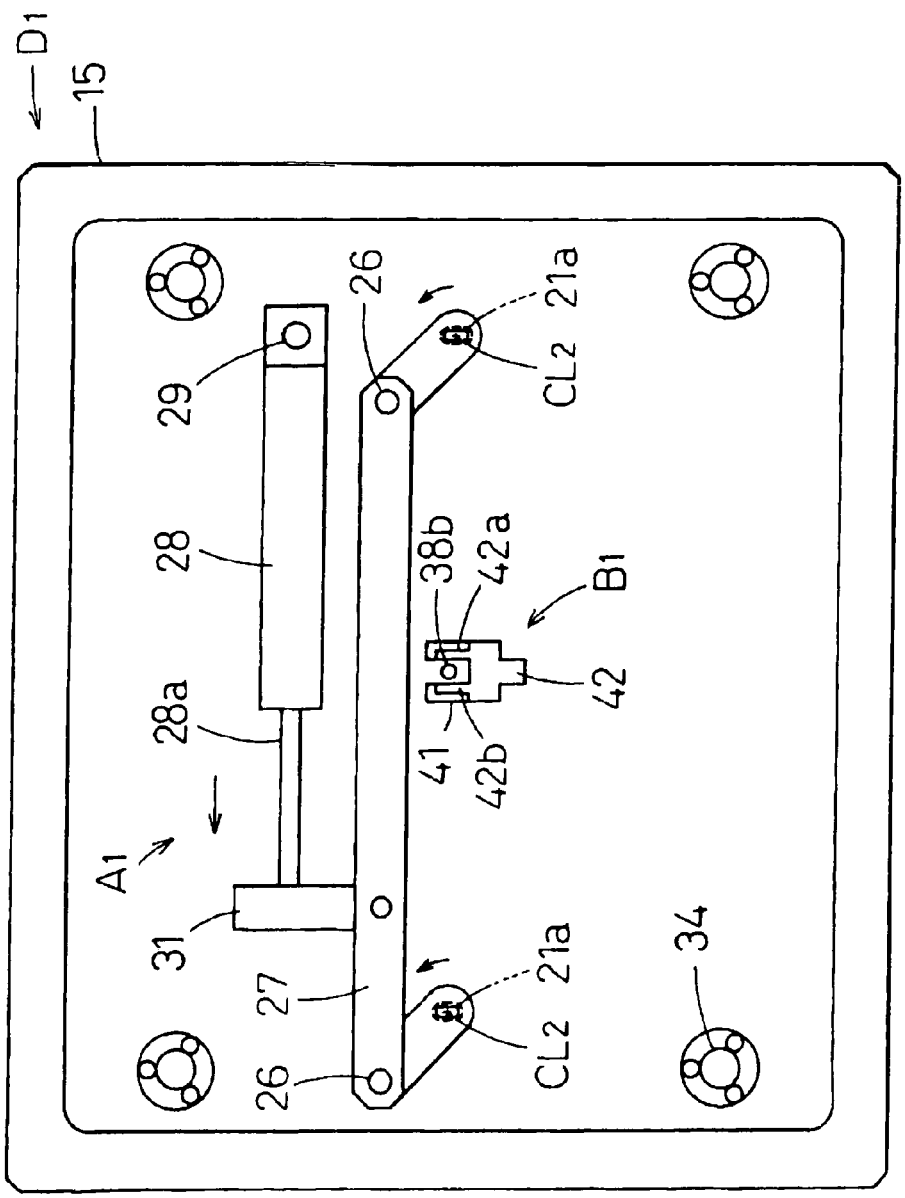
FIG. 19 is a similar view to FIG. 12, for explaining a state wherein the key element 21 has been pivoted.

Next, as shown in FIG. 19, the air cylinder 28 is driven to operate, in order to cause the cylinder rod 28a to protrude. Then, via the connecting plate 27, the pair of link plates 25 moves in the crank motion, and the pair of key elements 21 is synchronously pivoted around the respective center axes CL2 thereof through the predetermined angle (about 90 degrees). Thus, as shown in FIGS. 7 to 10, the upper and lower lock plates 19 move downward and upward, to move away from the fitting holes 23 provided in the lid attaching part 5a of the wafer carrier C. Then, the lock units E are unlocked.

At that time, since the respective main parts 21a of the key elements 21 are arranged in a standing-up position, they engage with corresponding keyholes 22 and may not come off therefrom. In addition, since the four corner-portions of the lid 6 are pressed by the respective pushing pins 32, the lid 6 is held in a tensed state against the lid holding plate 15. That is, the lid 6 is held in a more stable state by the lid holding plate 15.

The detecting pin 38 is pressed by the lid 6 and located at a backward position. At that time, the detecting-rod part 38b of the detecting pin 38 interrupts the ray 42c of the optical sensor 42, so that a detecting signal is outputted from the optical sensor 42.

Figure 20:
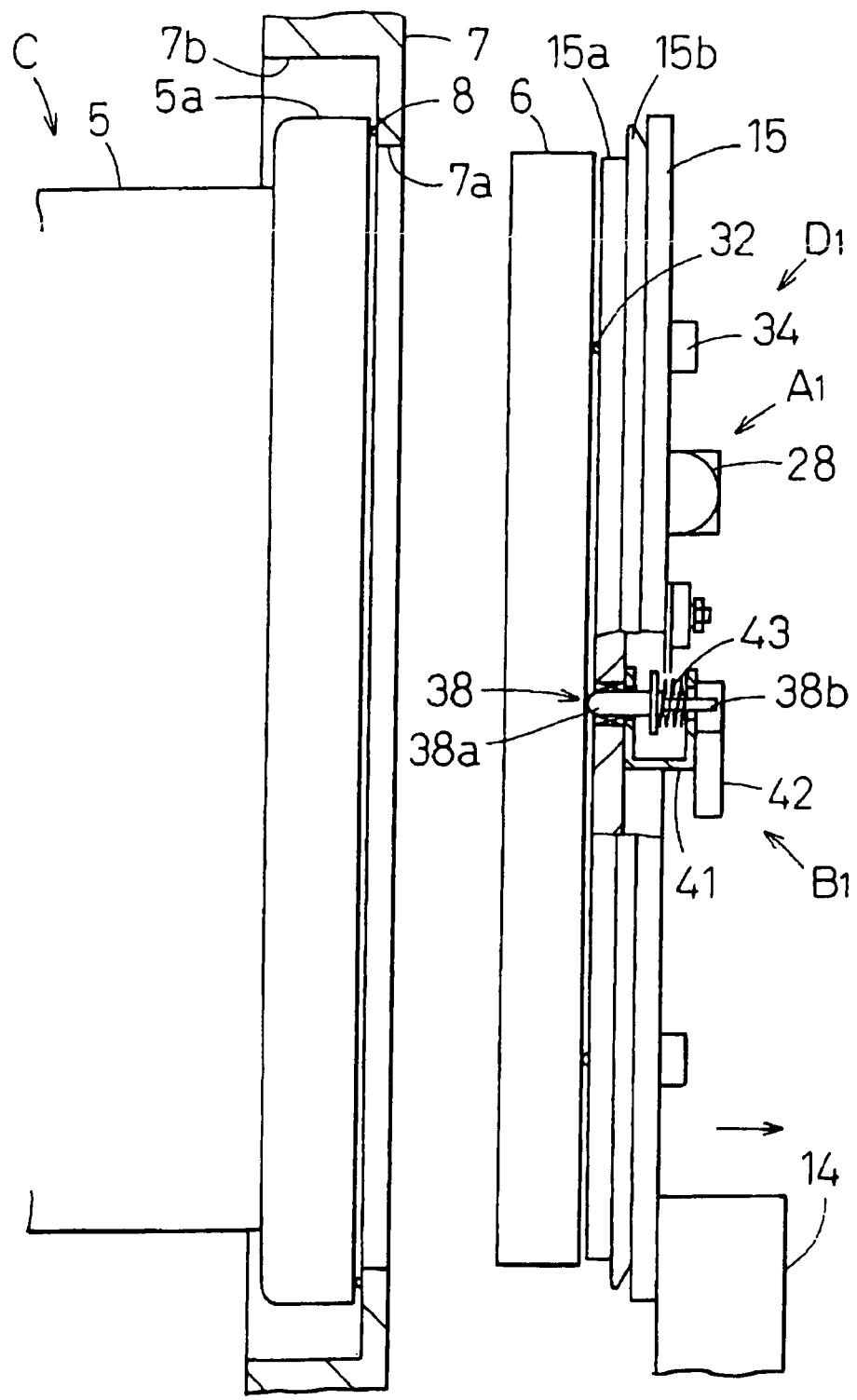
FIG. 20 is a similar view to FIG. 18, for explaining a state wherein a lid holding plate 15 is away from the attaching plate 7 and a lid 6 of the wafer carrier C is removed.

Next, the air cylinder 16 (see FIG. 2) is driven to operate, in order to cause the lid holding plate 15 to move toward the side of the semiconductor-device manufacturing unit H. As shown in FIG. 20, since the lid 6 is held by the lid holding plate 15, the lid 6 moves away from the attaching plate 7 together with the lid holding plate 15 as one body. Since the lid 6 is held by the lid holding plate 15, the detecting signal is outputted from the optical sensor 42 while the lid holding plate 15 moves. In the case, the attaching and removing unit $D_1$ operates normally and the usual operation is continued.

Herein, that the detecting signal is outputted from the optical sensor 42 means that the lid 6 presses the detecting pin 38. In order to hold the lid 6 in a substantially close contact with the lid holding plate 15 against the elastic force of the respective compressed springs 35, it is necessary for the main parts 21a of the pair of key elements 21, which form the key unit $A_1$, and the pair of keyholes 22 provided in the lid 6, which form the lock units E, to be engaged with each other.

If the main parts 21a of the pair of key elements 21 are broken off, the pair of key elements 21 is pivoted only in vain, so that they can not be engaged with the corresponding keyholes 22. In addition, in the case, since the lid 6 is pressed by the respective pushing pins 32, when the lid holding plate 15 moves away from the attaching plate 7, the pair of key elements 21 may come off from the corresponding keyholes 22 as it is. That is, only the lid holding plate 15 moves alone. At that time, the detecting pin 38 is forced to protrude from the lid holding plate 15 by means of the elastic force of the compressed spring 43. Thus, the detecting pin 38 moves forward, and the detecting-rod part 38b thereof stops interrupting the ray 42c of the optical sensor 42. As a result, the output of the detecting signal from the optical sensor 42 is stopped. As described above, it is detected that the lid holding plate 15 is not holding the lid 6, so that it is made possible to give a warning or the like of that fact. Thus, it is found out that either the key element 21 or the lock unit E has a hindrance.

Next, explained is a case wherein a power failure happened while the lid holding plate 15 held the lid 6. In common cases, when electric power supply is restarted after the power failure, the pair of key elements 21 is returned to starting-points thereof, that is, the main parts 21a of the pair of key elements 21 are returned to their horizontal positions. That state corresponds to a state wherein the engagement between the main parts 21a of the pair of key elements 21 and the corresponding keyholes 22 has been released. Then, the lid 6 is pressed by the respective compressed springs 35 attached to the respective pushing pins 32. Thus, it is possible that the lid 6 moves away and falls down from the lid holding plate 15. However, in this embodiment, the optical sensor 42 can detect that the lid holding plate 15 is holding the lid 6. Thus, if the lid holding plate 15 is holding the lid 6, when the electric power supply is restarted, a controlling part 42m (see FIG. 16) can control a driving means 28d for the cylinder 28 in such a manner that the pair of key elements 21 is not returned to the starting-points thereof. Thus, it can be prevented that the lid 6 moves away and falls down.

As described above, in the case of the attaching and removing unit $D_1$ of the embodiment, it can be detected whether the lid 6 is held or not when the lid holding plate 15 moves away from the attaching plate 7. That the lid holding plate 15 moves away with holding the lid 6 means that the wafer carrier C is opened. Thus, an arm of a robot unit (not shown) can move into the wafer carrier C without interfering with the lid 6. Then, the wafers U contained in the wafer carrier C are transferred into the semiconductor-device manufacturing unit H.

The wafers U are processed in the semiconductor-device manufacturing unit H, and then contained in the wafer carrier C again. Then, in completely reverse order of the above operations, the lid 6 is attached to the lid attaching part 5a of the carrier body 5 of the wafer carrier C, and the lock units E are locked.

Then, with reference to FIGS. 21 to 26, an attaching and removing unit $D_2$ of a second embodiment according to the invention is explained.

Figure 21:
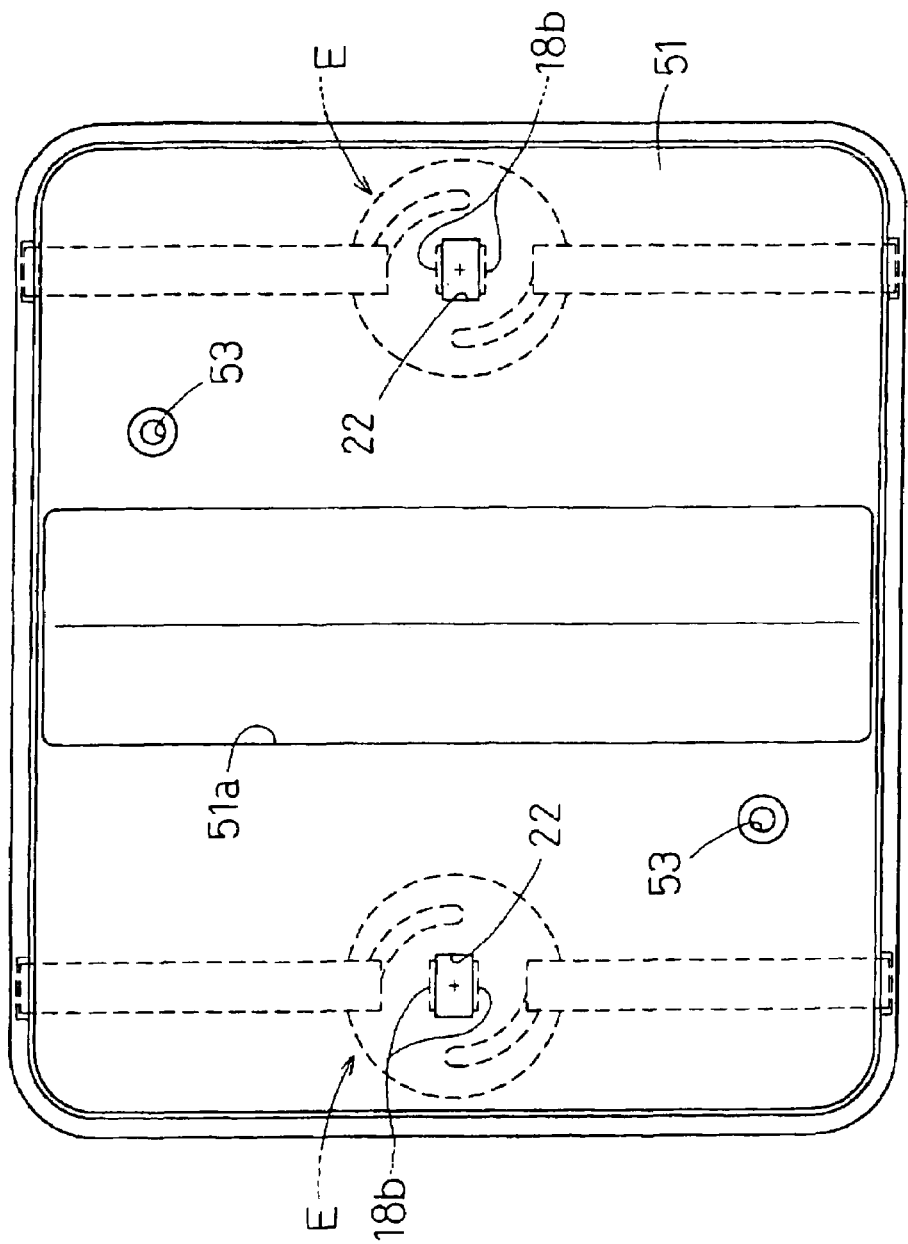
FIG. 21 is a front view of a lid 51 provided with a recess part 51a in a central portion thereof, in a second embodiment according to the invention.

Similarly to the attaching and removing unit $D_1$ of the first embodiment, the attaching and removing unit $D_2$ of the second embodiment mainly consists of lock units E provided on a lid 51 of a wafer carrier C, and a key unit $A_2$ and a lid detecting unit $B_2$ provided on a lid holding plate 52. As shown in FIG. 21, a recess portion 51a is formed in a substantially central portion of the lid 51. In addition, pin holes 53 are formed at an upper portion and a lower portion of the lid 51 for being positioned with respect to the key unit $A_2$. The structure of the lock unit E is completely the same as that in the first embodiment, that is, the lock unit E has a keyhole 22.

At first, the key unit $A_2$ of the embodiment is explained.

Figure 22:
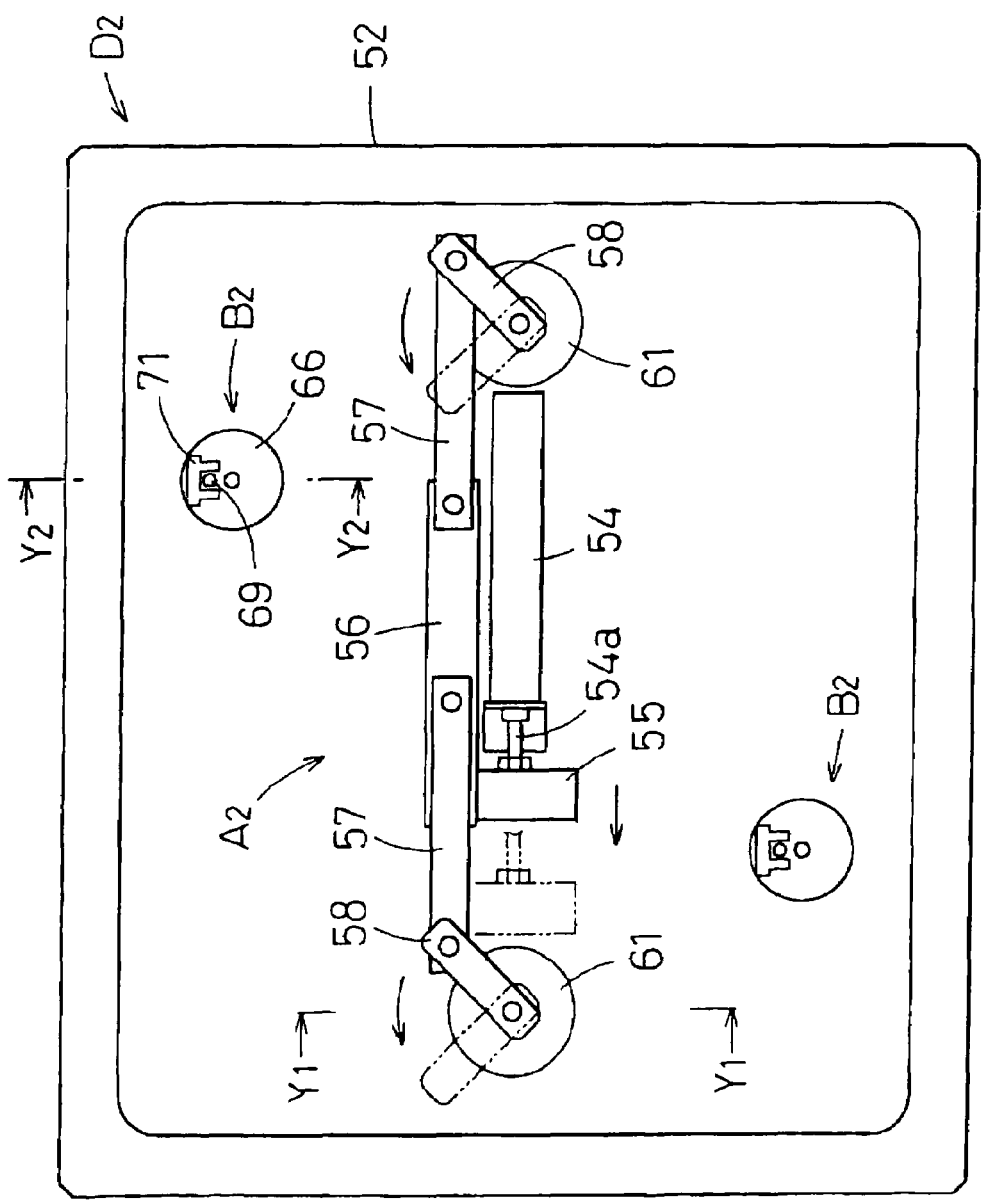
FIG. 22 is a backside view of a key unit $A_2$ and a lid-detecting unit $B_2$ in the second embodiment according to the invention.

As shown in FIG. 22, an air cylinder 54 is arranged on a backside of the lid holding plate 52, in parallel with a board surface of the lid holding plate 52. A connecting plate 56 is arranged above the air cylinder 54, substantially in parallel with the air cylinder 54, via a connecting block 55 attached to a cylinder rod 54a of the air cylinder 54. Respective two link plates 57, 58 are pivotably connected at both ends of the connecting plate 56, so that a pair of key elements 59 is linked with each other via the respective link plates 57, 58.

As shown in FIGS. 23 and 24, each of the pair of key elements 59 is supported by a bearing 62 arranged in a cylindrical bracket 61, so that each of the pair of key elements 59 is pivotable. A tip part thereof (a main part 59a) protrudes from the lid holding plate 52. The pair of link plates 58 is connected to the corresponding link plates 57, in a substantially parallel direction with each other, so that a parallel link mechanism is formed. Thus, when the air cylinder 54 is driven to operate, the pair of key elements 59 can be synchronously pivoted in the same direction only through a predetermined angle. In FIG. 22, two-dot chain lines represent a state wherein the pair of link plates 58 is pivoted by causing the air cylinder 54 to operate.

A pushing tube 63 is fitted in the bracket 61 around an outside periphery of each of the pair of key elements 59. A compressed spring 64 is arranged adjacently to a rear end (backside end) of the pushing tube 63. The pushing tube 63 is always forced forward (toward the lid 51) by means of the compressed spring 64.

Figure 25:
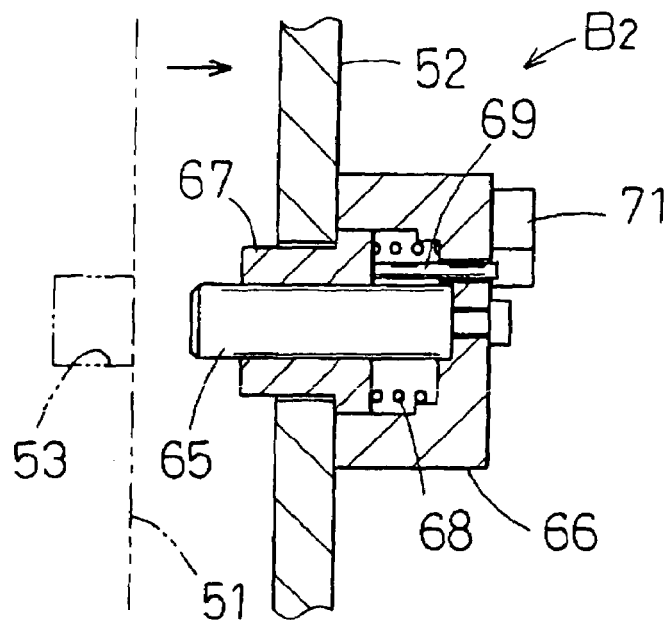
FIG. 25 is a sectional view taken along Y2—Y2 line of FIG. 22.
Figure 26:
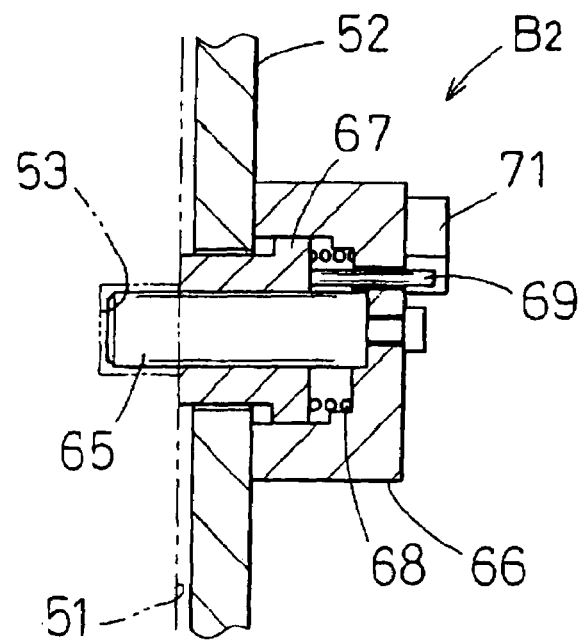
FIG. 26 is an explanatory view of an operation of the lid-detecting unit $B_2$ of FIG. 22.

Next, with reference to FIGS. 25 and 26, the lid detecting unit $B_2$ of the embodiment is explained. As described above, the pin holes 53 for a positioning operation are provided at the two positions in the lid 51 shown in FIGS. 25 and 26. At respective positions in the lid holding plate 52 that correspond to the respective pin holes 53, respective positioning pins 65 are arranged. Each of these positioning pins 65 is supported by a cylindrical bracket 66 attached to the backside surface of the lid holding plate 52 and a pushing tube 67 fitted in the bracket 66 around an outside periphery of the positioning pin 65. The pushing tube 67 is always forced forward (toward the lid 51) by means of a compressed spring 68, which is arranged adjacently to a rear end of the pushing tube 67. A detecting pin 69 protrudes from a rear end surface of the pushing tube 67 in an axial direction of the pushing tube 67 through the bracket 66. An optical sensor 71 is mounted at a backside upper portion of the bracket 66. The optical sensor 71 is the same as the optical sensor 42 of the first embodiment.

Next, an operation of the attaching and removing unit $D_2$ of the embodiment is explained.

When the lid 51 and the lid holding plate 52 relatively come close to each other, the respective positioning pins 65 are inserted into the corresponding pin holes 53 in the lid 51. At the same time, the main parts 59a of the key elements 59 are inserted into the keyholes 22 of the lid 51.

When the lid 51 and the lid holding plate 52 come close to each other further more, the lid 51 and the front end surfaces of the respective pushing tubes 63, 67 come in contact with each other, and the respective pushing tubes 63, 67 move rearward against the elastic restitutive force of the respective compressed springs 64, 68. At that time, since the pushing tubes 63, 67 press the lid 51, the lid 51 becomes in a tensed state. Thus, the lid 51 is held in a stable state. At the same time, the detecting pin 69 of the pushing tube 67, which forms the lid detecting unit $B_2$, interrupts a ray of the optical sensor 71, so that a detecting signal is outputted.

After that, when the air cylinder 54 is caused to operate, the pair of key elements 59 is pivoted through the predetermined angle, so that the lock units E of the lid 51 are unlocked.

In the case of the attaching and removing unit $D_2$ of the embodiment, since the positioning pins 65 are inserted into the pin holes 53 of the lid 51, the lid 51 and the key unit $A_2$ are surely positioned. In addition, since the pushing tubes 63, 67 press portions around the key elements 59 and around the positioning pins 65 in surface-to-surface contact, the lid 51 can be held in a more stable state compared with the case of the first embodiment pressing in point-to-point contact. Thus, the operation of the key unit $A_2$ becomes more stable. In addition, the lid 51 can be attached or removed in a more surely held state without trembling.

In addition, as shown in FIGS. 27 and 28, a rubber ring 72 (in the case of the embodiment, an O-ring) may be fitted in a front end surface of each pushing tube 67 (around each positioning pin 65), in such a manner that a part of the rubber ring 72 protrudes. In a case of such a lid detecting unit $B_2$, the lid 51 and the rubber ring 72 may be brought to close contact with each other, so that a great frictional force may be generated between them. Thus, it is prevented that the lid 51 moves out of posit-ion because of its own weight, so that the lid 51 is held more stably.

In addition, if a rubber ring is fitted in a front end surface of each pushing tube 63 shown in FIG. 23, the same effect can be achieved.

The lid detecting units $B_1$, $B_2$ in the above respective embodiments have the structure wherein when the lid 6, 51 is held in a substantially close contact manner by the lid holding plate 15, 52, the detecting pin 38 or the pushing tube 67 is pressed so that the optical sensor 42, 71 operates to output the detecting signal. That is, the optical sensor 42, 71 is caused to operate by the lid 6, 51 coming into contact with the detecting pin 38 or the pushing tube 67. Thus, the detecting operation can be carried out regardless of the material of the lid 6, 51. Thus, if the lid 6, 51 is transparent, the detecting operation can be carried out surely. It is possible that a non-contact sensor such as an optical sensor, an ultrasonic sensor, an infrared sensor or the like is buried in the lid holding plate 15, 52, in order to detect in a non-contact manner whether the lid 6, 51 exists or not.

In the above description, the detecting pin 38 is provided on the pushing tube 67. However, if a detecting pin is provided in a pushing tube 63, the same effect can be achieved.

Figure 29:
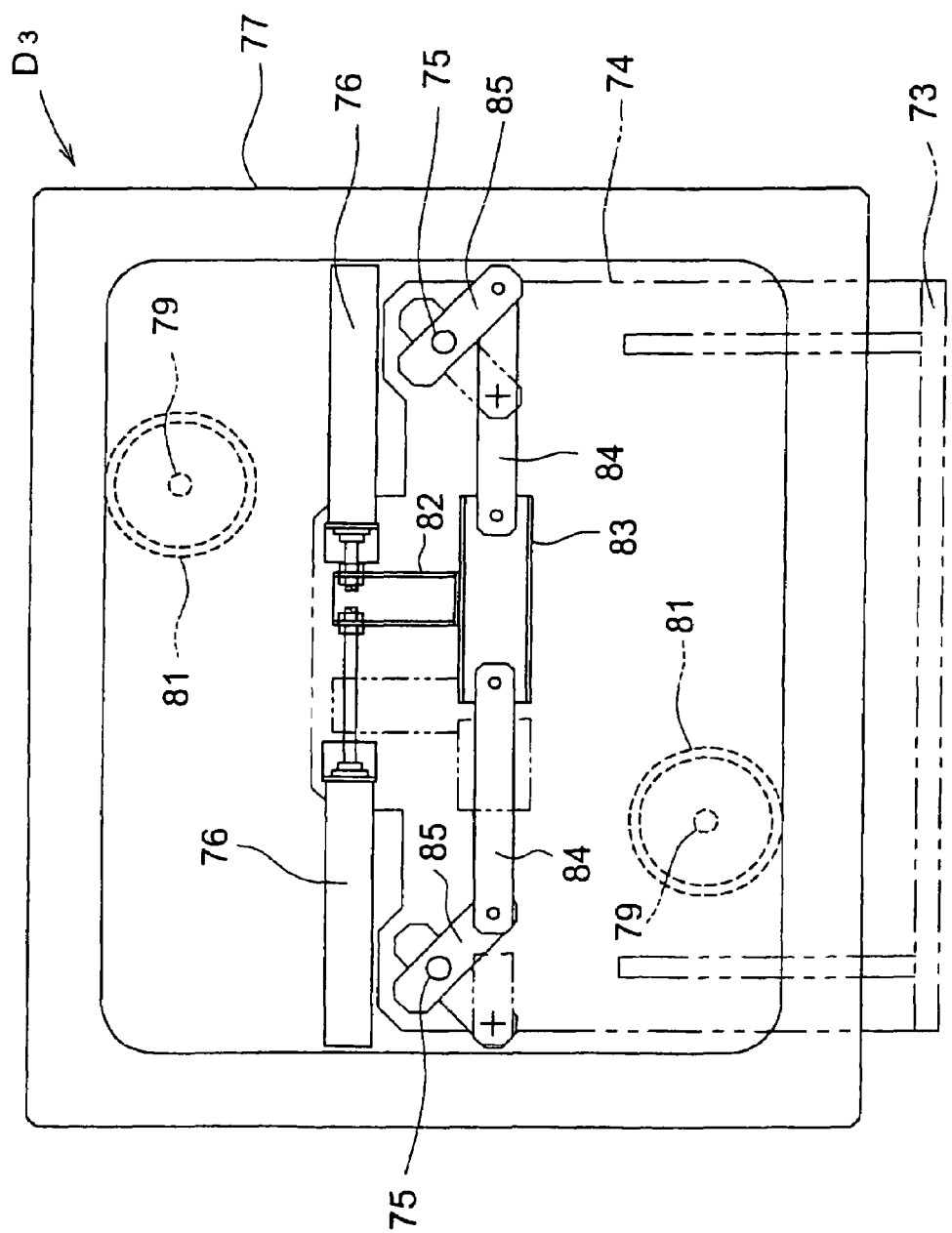
FIG. 29 is a backside view of a key unit and a lid-detecting unit in a third embodiment according to the invention, similar to FIG. 12.

Next, an attaching and removing unit $D_3$ of a third embodiment according to the invention is explained. With reference to FIGS. 29 and 30, in the attaching and removing unit $D_3$ of the third embodiment, a pair of key elements 75 is attached to a bracket 74 (a driving plate) standing on a base plate 73, which can move in front- and rearward directions (right and left directions in the drawing) and which is equivalent for a guide plate. The pair of key elements 75 can be pivoted by causing a pair of air cylinders 76 arranged on a back side of the bracket 74 to operate.

A lid holding plate 77 of the attaching and removing unit $D_3$ of the embodiment is mounted in a relatively movable manner with respect to the pair of key elements 75. In addition, a compressed spring 78 (an example of forcing member) is fitted between the bracket 74 and the lid holding plate 77 around each of the pair of key elements 75. Respective rubber rings 81 are fitted around respective positioning pins 79 that protrude from a front surface of the lid holding plate 77.

The pair of air cylinders 76 and the pair of key elements 75 are linked via respective connecting members 82, 83 and 84 and a pair of link plates 85.

Then, with reference to FIGS. 30 and 31, an operation of the embodiment is explained.

At first, the pair of key elements 75 and the lid holding plate 77 move toward the attaching plate 7 that forms the loading-port unit L. Then, the lid holding plate 77 is pressed to the attaching plate 7, so that the moving force of the above movement and the elastic force of the compressed spring 78 become equal. At that time, the compressed spring 78 contracts more, so that main parts 75a of the pair of key elements 75 protrude from the front surface of the lid holding plate 77.

Then, as shown in FIG. 31, the wafer carrier C moves forward from a side opposite to the attaching plate 7, so that the lid 51 thereof comes in contact with the rubber rings 81 of the lid holding plate 77. At that time, the respective main parts 75a of the pair of key elements 75 are inserted into the respective keyholes 22 provided in the lid 51 (for example, see FIG. 21). In that state, if the pair of air cylinders 76 is driven to operate, the pair of key elements 75 is pivoted in a predetermined direction, so that the lock units E provided in the lid 51 are unlocked.

After that, if the key elements 75 move rearward (in the right direction in the drawings), the lid 51 of the wafer carrier C also moves rearward. However, since the lid holding plate 77 is pressed forward (in the left direction in the drawings) by the compressed spring 78, the lid 51 of the wafer carrier C is held not to move out of position with respect to the lid holding plate 77. At that time, the lid 51 and each of the rubber rings 81 come to close contact with each other, so that a great frictional force is generated between them. Thus, it is prevented that the lid 51 moves out of position because of its own weight. That is, in the attaching and removing unit $D_3$ of the embodiment, since the lid 51 of the wafer carrier C is held by the rubber rings 81 of the lid holding plate 77, the lid 51 can be held more surely.

The rubber ring may be arranged at any portion corresponding to a plane part facing the lid. For example, it may be fitted around the key element or along an outside periphery of the lid.

In addition, in the embodiment as well, it is preferable that a lid detecting unit $B_1$ or $B_2$ as shown in FIG. 16 or FIG. 25 or FIG. 27 is provided for example in the vicinity of a positioning pin 79.

Next, a loading-port unit $L_4$ having an attaching and removing unit of a fourth embodiment according to the invention is explained.

Figure 32:
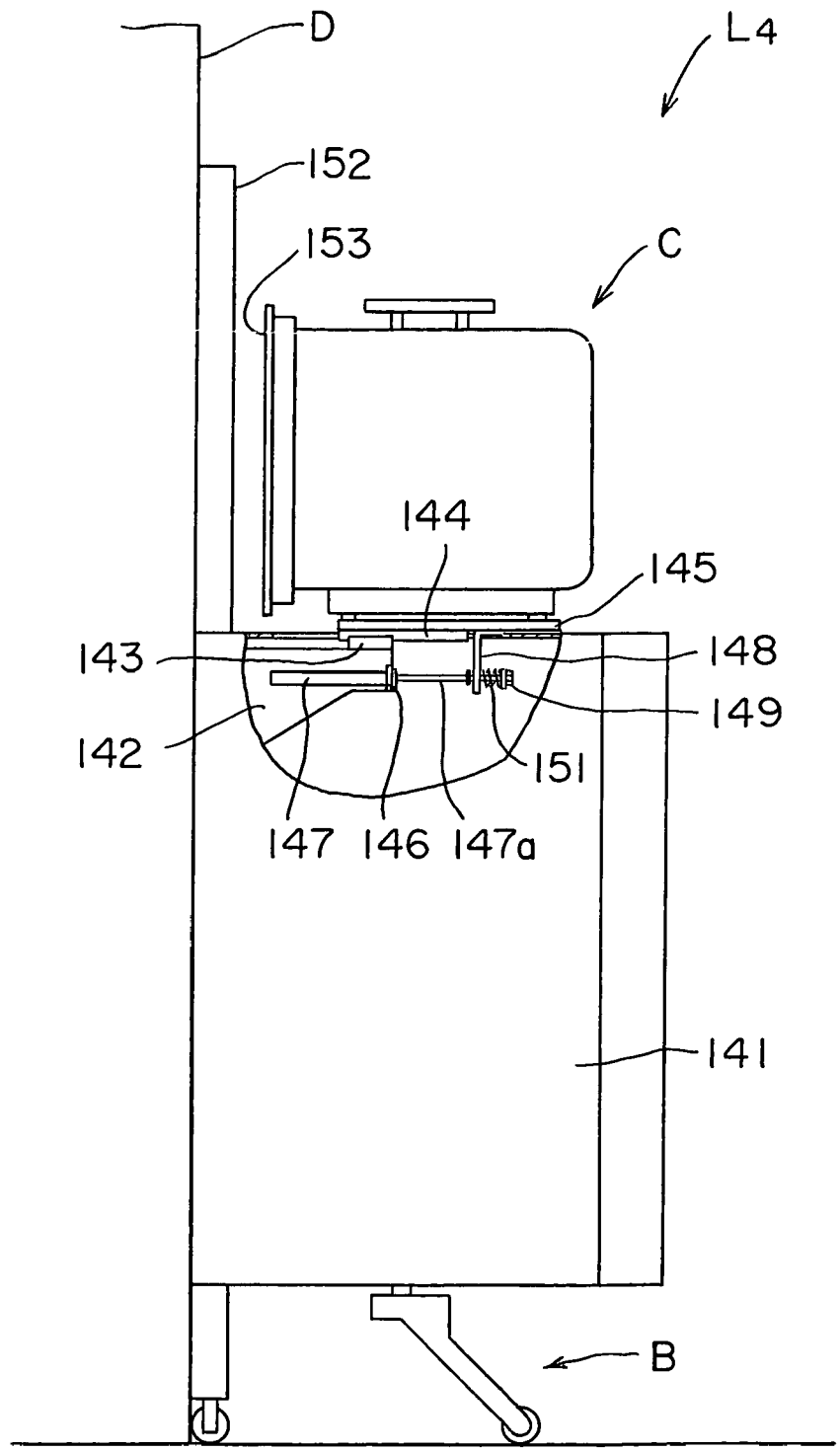
FIG. 32 is a schematic view showing a portion around a wafer carrier in a fourth embodiment according to the invention.

With reference to FIGS. 32 and 33, a substantially triangular bracket 142 is fixed to a side facing a semiconductor-device manufacturing unit D in a carrier-placing body 141, which forms the loading-port unit $L_4$. A guide block 143 is attached substantially horizontally on an upper surface of the bracket 142. A guide rail 144 is arranged movably in the front- and rearward directions on the guide block 143. A carrier-placing plate 145 is mounted on an upper surface of the guide rail 144 in order to place a wafer carrier C thereon.

When the guide rail 144 fitted on the guide block 143 is caused to move in the front- and rearward directions, the carrier-placing plate 145 can move in the same directions. A cylinder bracket 146 is fixed to a rear end portion (a right end portion in the drawings) of the bracket 142 in such a manner that the cylinder bracket 146 protrudes sideways. An air cylinder 147 is supported by the cylinder bracket 146 in a longitudinal direction of the guide rail 144. A cylinder rod 147a of the air cylinder 147 protrudes through a through-hole 148a of a connecting plate 148, which is fixed to a bottom surface of the carrier-placing plate 145, to a rear area (a right area in the drawings) with respect to the connecting plate 148. A compressed spring 151 is fitted between a hexagonal nut 149 engaged with a tip portion of the cylinder rod 147a and the connecting plate 148.

The air cylinder 147 is driven to operate so that the cylinder rod 147a retracts. Then, the connecting plate 148 is pulled via the compressed spring 151, so that the carrier-placing plate 145 moves forward while guided by the guide block 143. Even if the cylinder rod 147a of the air cylinder 147 is caused to retract more after a surface to be attached 153 (a front surface) of the wafer carrier C comes into contact with an attaching surface 142a of the attaching plate 152 because of a dimensional error of the length of the wafer carrier C, the shock force is absorbed by the compressed spring 151 being further more compressed. Thus, it is prevented that the surface to be attached 153 of the wafer carrier C collides with the attaching surface 152a of the attaching plate 152 with a great force. Thus, there is no possibility that the surface to be attached 153 is damaged.

In addition, even if there is an error in accuracy, a frame of the carrier and the attaching plate can be brought into close contact with each other by means of the function of the spring.

Figure 35:
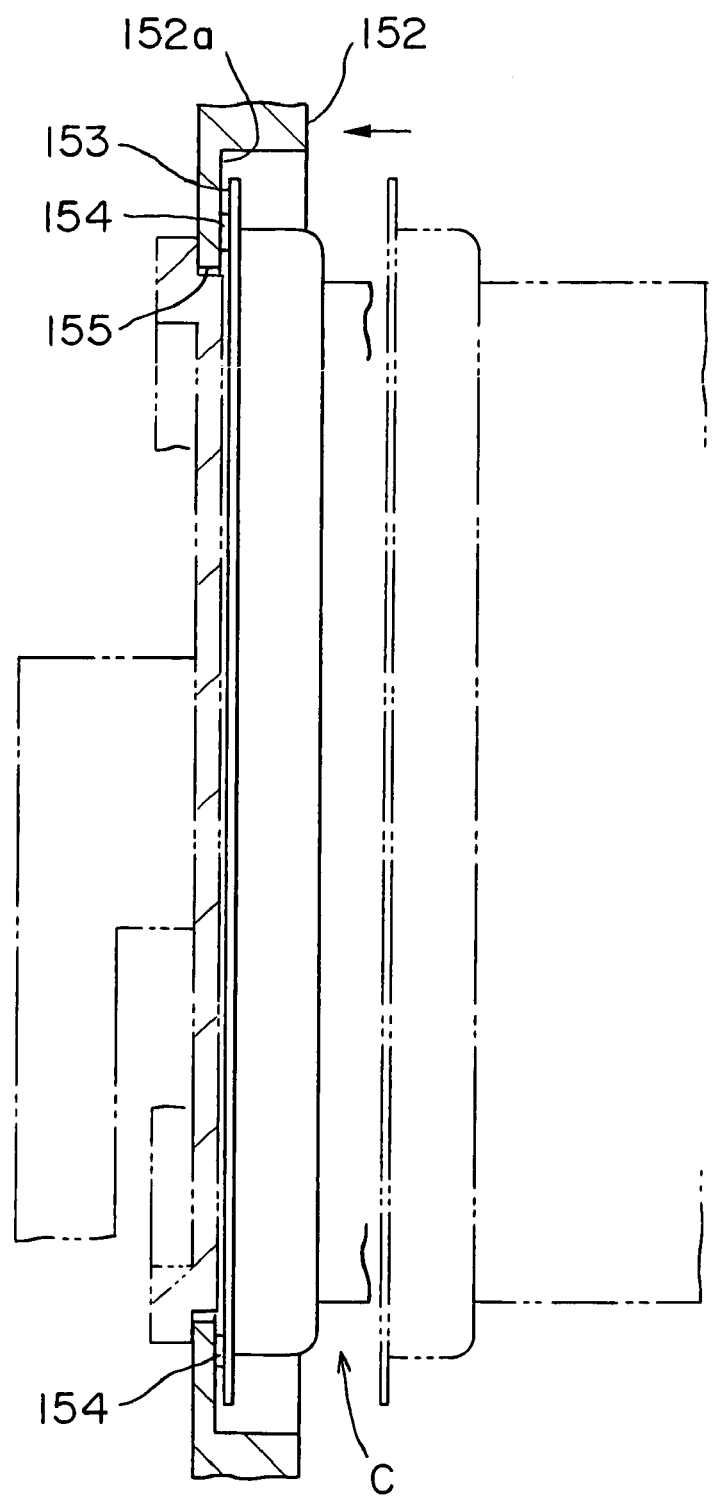
FIG. 35 is a schematic side view of the attaching plate when the disk members made of resin are attached to the four corner-portions of the attaching surface of the attaching plate.
Figure 36:
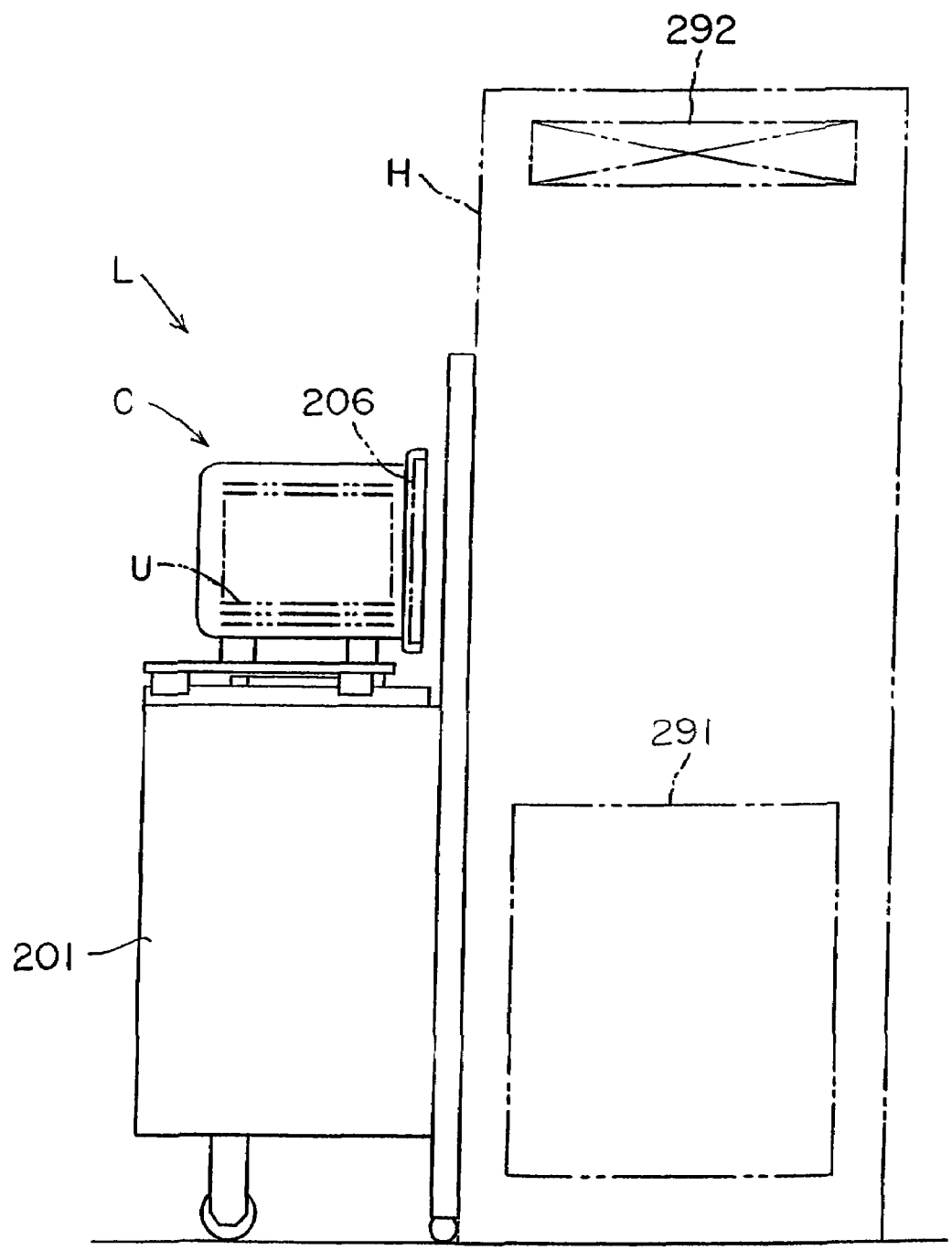
FIG. 36 is a side view of a semiconductor-device manufacturing unit H provided with a loading-port unit L.
Figure 37:
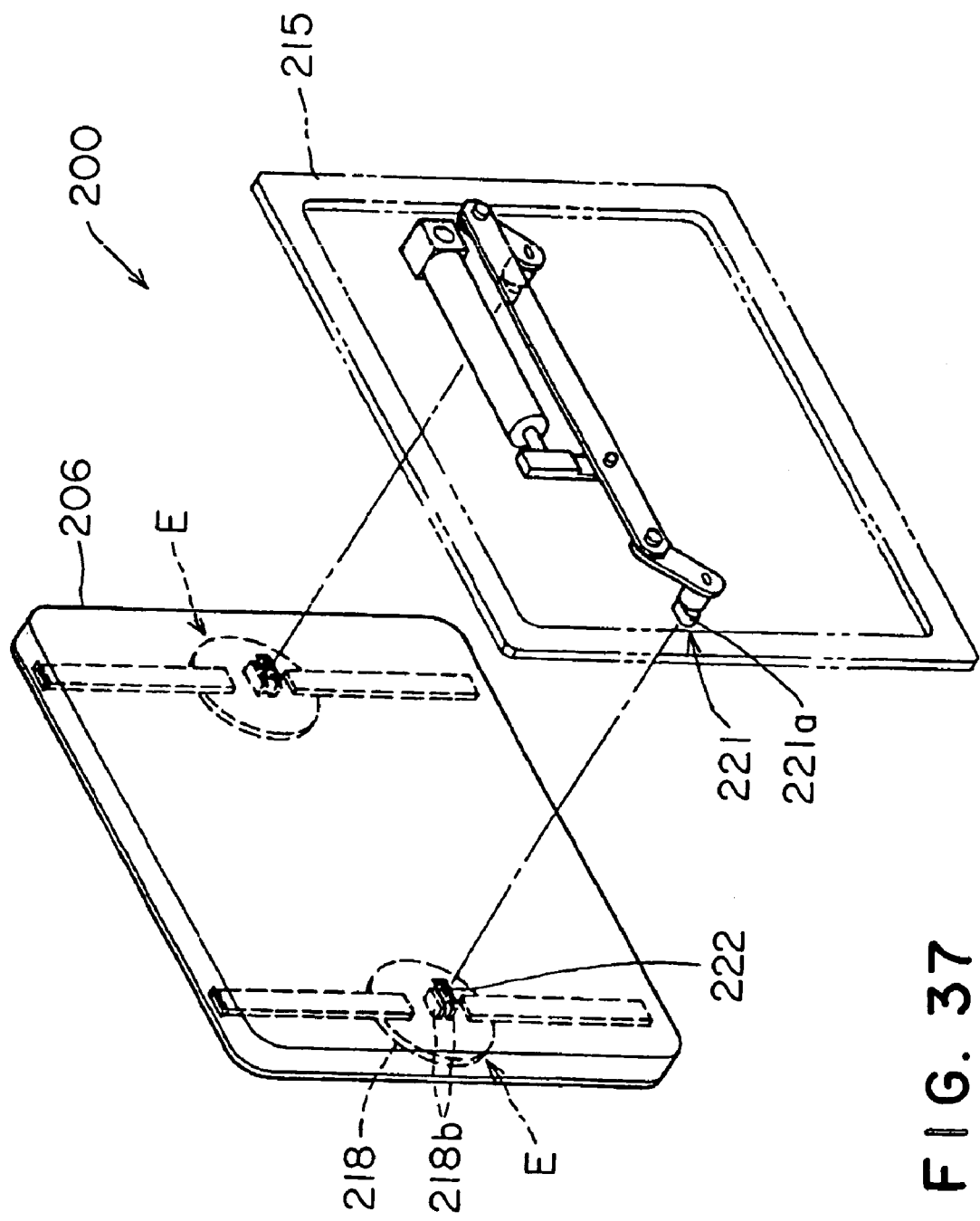
FIG. 37 is a perspective view of a conventional attaching and removing unit.

In addition, as shown in FIGS. 34 and 35, a buffer member may be attached to the attaching surface 152a of the attaching plate 152. In this embodiment, disks 154 made of resin material are buried in the attaching surface 152a at four corner-portions thereof in such a manner that the disks 154 a little protrude rearward from the attaching surface 152a. When the wafer carrier C is caused to move forward, the surface to be attached 153 comes into contact with the respective disks 154. Thus, the surface to be attached 153 never meets the attaching surface 152a made of metal. Thus, there is no possibility that the surface to be attached 153 of the wafer carrier C is damaged. In FIGS. 34 and 35, 155 represents a transferring window.

The feature of the embodiment can be combined with each of the above first to third embodiments, in order to create a more useful unit.

What is claimed is:

1. An attaching and removing unit of a lid for a wafer carrier comprising:
    a lid holding plate that can move forward and backward relative to a lid for a wafer carrier provided with a lock unit having a keyhole exposed outside the lid for a wafer carrier;
    a driver for causing the lid holding plate to move forward and backward;
    a key element protruding from the lid holding plate on a side of the lid in a pivotable manner, the key element disposed opposite the keyhole in a direction of the forward and backward movement;
    a lid-detecting unit provided at the lid holding plate, for detecting whether the lid holding plate is holding the lid or not; and
    a pushing member for giving a driving force to the lid in a direction of moving the lid away from the lid holding plate against the engagement of the key element and the keyhole,
    wherein the lock unit is adapted to be locked and unlocked by the key element pivoting in the keyhole.

2. An attaching and removing unit of a lid for a wafer carrier according to claim 1, wherein: the lid-detecting unit has:
    a member to be detected whose position is changed dependently on whether the lid holding plate is holding the lid or not, and
    a detector that detects a position of the member to be detected.

3. An attaching and removing unit of a lid for a wafer carrier according to claim 1, further comprising:
    a controller that controls the key element in such a manner that control of the key element for returning to a starting-point thereof is not conducted if the lid holding plate is holding the lid, based on an output of the lid-detecting unit, when electric power starts to be supplied.

4. An attaching and removing unit of a lid for a wafer carrier according to claim 1, wherein:
    the wafer carrier is placed on a movable placing part that can move in the same directions as the forward and backward movement directions of the lid holding plate by the driver, and
    the movable placing part is connected to a second driver for causing the movable placing part to move, via a buffering member.

5. An attaching and removing unit of a lid for a wafer carrier comprising:
    a lid holding plate that can move forward and backward relative to a lid for a wafer carrier provided with a lock unit having a keyhole exposed outside the lid for a wafer carrier;
    a driver for causing the lid holding plate to move forward and backward; a key element protruding from the lid holding plate on a side of the lid in a pivotable manner, the key element disposed opposite the keyhole in a direction of the forward and backward movement;
    a lid-detecting unit provided at the lid holding plate, for detecting whether the lid holding plate is holding the lid or not; and
    a biasing member for biasing the lid holding plate in a direction of pushing the lid, wherein the lock unit is adapted to be locked and unlocked by the key element pivoting in the keyhole.

6. An attaching and removing unit of a lid for a wafer carrier according to claim 5, wherein:

the lid-detecting unit has:
a member to be detected whose position is changed dependently on whether the lid holding plate is holding the lid or not, and
a detector that detects a position of the member to be detected.

7. An attaching and removing unit of a lid for a wafer carrier according to claim 5, further comprising:
a controller that controls the key element in such a manner that control of the key element for returning to a starting-point thereof is not conducted if the lid holding plate is holding the lid, based on an output of the lid-detecting unit, when electric power starts to be supplied.

8. An attaching and removing unit of a lid for a wafer carrier according to claim 5, wherein:
the wafer carrier is placed on a movable placing part that can move in the same directions as the forward and backward movement directions of the lid holding plate by the driver, and
the movable placing part is connected to a second driver for causing the movable placing part to move, via a buffering member.

* * * * *